US012676170B2

(12) United States Patent
Jang et al.

(10) Patent No.: US 12,676,170 B2
(45) Date of Patent: Jul. 7, 2026

(54) BITLINE SENSE AMPLIFIERS AND SEMICONDUCTOR DEVICES INCLUDING THE SAME

(71) Applicant: Samsung Electronics Co., Ltd., Suwon-si (KR)

(72) Inventors: Miji Jang, Suwon-si (KR); Dongil Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 18/822,985

(22) Filed: Sep. 3, 2024

(65) Prior Publication Data

US 2025/0279124 A1     Sep. 4, 2025

(30) Foreign Application Priority Data

Mar. 4, 2024     (KR) ......................... 10-2024-0030482

(51) Int. Cl.
| | |
|---|---|
| *G11C 7/08* | (2006.01) |
| *G11C 7/12* | (2006.01) |
| *G11C 7/18* | (2006.01) |
| *G11C 29/02* | (2006.01) |

(52) U.S. Cl.
CPC .................. *G11C 7/08* (2013.01); *G11C 7/12* (2013.01); *G11C 7/18* (2013.01); *G11C 29/026* (2013.01)

(58) Field of Classification Search
CPC .................................................. G11C 29/026
See application file for complete search history.

(56) References Cited

U.S. PATENT DOCUMENTS

| | | | | |
|---|---|---|---|---|
| 8,599,623 | B1 * | 12/2013 | Clark | ..................... G01R 35/00 |
| | | | | 365/201 |
| 10,586,586 | B1 | 3/2020 | Lee et al. | |
| 10,839,873 | B1 | 11/2020 | Lee | |
| 11,087,805 | B2 | 8/2021 | Lee | |
| 2014/0085992 | A1 | 3/2014 | Thompson et al. | |
| 2020/0365194 | A1 | 11/2020 | Yun | |
| 2022/0262409 | A1 | 8/2022 | Lin et al. | |
| 2022/0293141 | A1 | 9/2022 | Lin et al. | |

FOREIGN PATENT DOCUMENTS

| | | |
|---|---|---|
| CN | 115691587 A | 2/2023 |
| KR | 20200131550 A | 11/2020 |
| KR | 20230005623 A | 1/2023 |

* cited by examiner

*Primary Examiner* — Jason Lappas
(74) *Attorney, Agent, or Firm* — Wolf, Greenfield & Sacks, P.C.

(57) ABSTRACT
A bitline sense amplifier comprising: a P-type sense amplifier including a first PMOS transistor and a second PMOS transistor, wherein the first PMOS transistor and the second PMOS transistor are electrically connected to a first sense enable line; an N-type sense amplifier including a first NMOS transistor and a second NMOS transistor, wherein the first NMOS transistor and the second NMOS transistor are electrically connected to a second sense enable line; a first isolation transistor electrically connected to the first PMOS transistor and to the first NMOS transistor; a second isolation transistor electrically connected to the second PMOS transistor and to the second NMOS transistor; a first transistor electrically connected to a first node that is between the first PMOS transistor and the first isolation transistor; and a second transistor electrically connected to a second node that is between the second PMOS transistor and the second isolation transistor.

20 Claims, 27 Drawing Sheets

200

300

400

400

400

400

400

400

400

400

400

VSS

400

BITLINE SENSE AMPLIFIERS AND SEMICONDUCTOR DEVICES INCLUDING THE SAME

CROSS-REFERENCE TO RELATED APPLICATIONS

This application claims benefit of priority to Korean Patent Application No. 10-2024-0030482 filed on Mar. 4, 2024 in the Korean Intellectual Property Office, the disclosure of which is incorporated herein by reference in its entirety.

BACKGROUND OF THE INVENTION

The present inventive concept relates to bitline sense amplifiers and semiconductor devices including the same.

A memory device may be a semiconductor device storing data and reading the stored data, and may include a memory cell array in which memory cells storing the data are arranged, a sense amplifier (e.g., a bitline sense amplifier) connected (e.g., electrically connected) to the memory cells to record or read the data, or the like. A bitline sense amplifier may be connected (e.g., electrically connected) to a pair of bitlines, and may perform a read operation of reading data from a selected memory cell connected (e.g., electrically connected) to one of the pair of bitlines by comparing voltages between the pair of bitlines. In order to improve the accuracy of the read operation, compensating offset between elements included in the bitline sense amplifier may be necessary.

SUMMARY OF THE INVENTION

An aspect of the present inventive concept is to provide a bitline sense amplifier capable of improving performance thereof by using elements that may be arranged in a symmetrical structure, and canceling offset respectively existing in a P-type sense amplifier and an N-type sense amplifier in a plurality of operations, and a semiconductor device including the same.

According to an aspect of the present inventive concept, a bitline sense amplifier comprising: a P-type sense amplifier including a first p-channel metal-oxide-semiconductor (PMOS) transistor and a second PMOS transistor, wherein the first PMOS transistor and the second PMOS transistor are electrically connected to a first sense enable line; an N-type sense amplifier including a first n-channel metal-oxide-semiconductor (NMOS) transistor and a second NMOS transistor, wherein the first NMOS transistor and the second NMOS transistor are electrically connected to a second sense enable line; a first isolation transistor electrically connected to the first PMOS transistor and to the first NMOS transistor; a second isolation transistor electrically connected to the second PMOS transistor and to the second NMOS transistor; a first transistor electrically connected to a first node that is between the first PMOS transistor and the first isolation transistor; and a second transistor electrically connected to a second node that is between the second PMOS transistor and the second isolation transistor.

According to an aspect of the present inventive concept, a semiconductor device comprising: a P-type sense amplifier and an N-type sense amplifier, wherein the P-type sense amplifier and the N-type sense amplifier are electrically connected to a bitline and a complementary bitline; a first isolation transistor and a second isolation transistor that are electrically connected to the P-type sense amplifier and to the N-type sense amplifier; a first transistor electrically connected to a first node that is between the first isolation transistor and the P-type sense amplifier; a second transistor electrically connected to a second node that is between the second isolation transistor and the P-type sense amplifier; and a control logic configured to control on-off switching of each of the first isolation transistor, the second isolation transistor, the first transistor, and the second transistor, and configured to control a voltage of a first sense enable line electrically connected to the P-type sense amplifier and a voltage of a second sense enable line electrically connected to the N-type sense amplifier, wherein the control logic is further configured to turn on the first transistor and the second transistor and turn off the first isolation transistor and the second isolation transistor in a first offset canceling operation, turn off the first transistor and the second transistor and input a first power voltage to each of the first sense enable line and the second sense enable line in a second offset canceling operation, and turn on the first transistor and the second transistor in a third offset canceling operation.

According to an aspect of the present inventive concept, a semiconductor device includes a bitline sense amplifier electrically connected to a bitline, a complementary bitline, a first sense enable line, and a second sense enable line; and a control logic configured to control the bitline sense amplifier to execute a read operation to read data from a memory cell electrically connected to the bitline, wherein the bitline sense amplifier includes a P-type sense amplifier electrically connected to the first sense enable line, an N-type sense amplifier electrically connected to the second sense enable line, an isolation circuit electrically connected to the P-type sense amplifier and to the N-type sense amplifier, and an offset canceling circuit electrically connected to nodes that are between the P-type sense amplifier and the isolation circuit, wherein the control logic is further configured to electrically connect the nodes to each other through the offset canceling circuit to compensate for an offset of the N-type sense amplifier and an offset of the P-type sense amplifier, while isolating the P-type sense amplifier and the N-type sense amplifier and applying a first power supply voltage to the second sense enable line, and wherein the bitline sense amplifier includes transistors that are symmetrically positioned.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred embodiments of the present inventive concept will be described with reference to the attached drawings.

Figure 1:
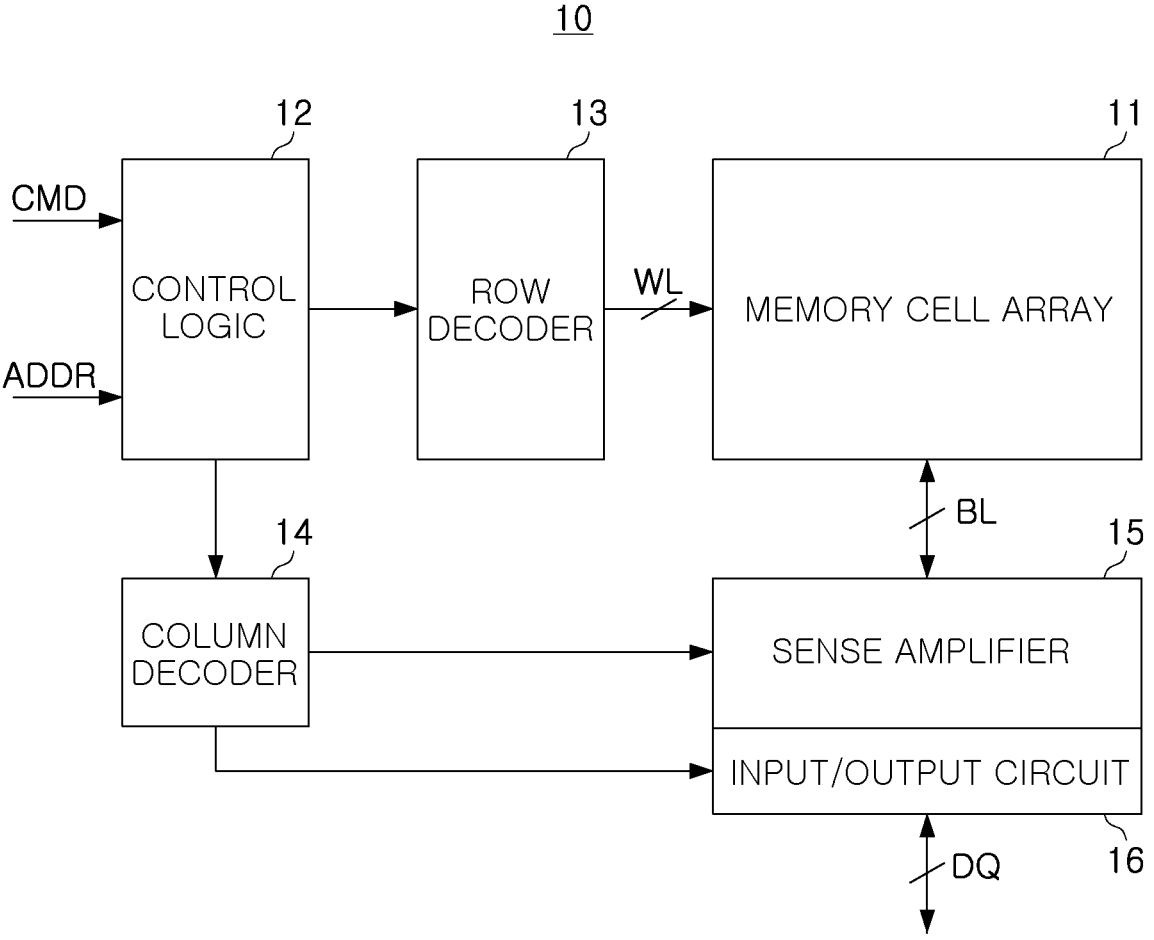
FIG. 1 is a block diagram illustrating a semiconductor device according to some embodiments.

FIG. 1 is a block diagram illustrating a semiconductor device according to some embodiments.

Referring to FIG. 1, a semiconductor device 10 according to some embodiments may be a storage device based on a semiconductor element. The semiconductor device 10 may be a random access memory (RAM) device such as a dynamic random access memory (DRAM), a synchronous DRAM (SDRAM), a static RAM (SRAM), a double date rate SDRAM (DDR SDRAM), a DDR2 SDRAM, a DDR3 SDRAM, a phase-change RAM (PRAM), a magnetic RAM (MRAM), a resistive RAM (RRAM), or the like. In response to an address signal ADDR and a control command signal CMD, received from an external host (e.g., a central processing unit (CPU), an application processor (AP), or a system-on-chip (SoC)), the semiconductor device 10 may store data received through a data signal DQ or may output data as a data signal DQ. The semiconductor device 10 may include a memory cell array 11, a control logic 12, a row decoder 13, a column decoder 14, a sense amplifier 15, an input/output circuit 16, and the like. As used hereinafter, the terms "external/outside configuration", "external/outside device", "external/outside power", "external/outside signal", or "outside" are intended to broadly refer to a device, circuit, block, module, power, and/or signal that resides externally (e.g., outside of a functional or physical boundary) with respect to a given circuit, block, module, system, or device.

The memory cell array 11 may include a plurality of memory cells, and the plurality of memory cells may be connected (e.g., electrically connected) to the row decoder 13 and the sense amplifier 15, through a plurality of wordlines WL and a plurality of bitlines BL. Each of the plurality of memory cells may be located at a point at which the plurality of wordlines WL and the plurality of bitlines BL intersect. The plurality of memory cells may be arranged in a matrix form in the memory cell array 11, and each of the plurality of memory cells may include at least one memory element for storing data. For example, when the semiconductor device 10 is a DRAM, each of the plurality of memory cells may include a switch element and a cell capacitor. It will be understood that when an element or layer is referred to as being "on", "responsive to", "connected to", or "coupled to" another element or layer, it may be directly on, responsive to, connected to, or coupled to the other element or layer, or one or more intervening elements or layers may be present. In contrast, when an element is referred to as being "directly on", "directly responsive to", "directly connected to", or "directly coupled to", another element, there are no intervening elements present. In addition, "electrical connection" conceptually includes a physical connection and a physical disconnection. Herein, when an element A is referred to as being "connected to" an element B (or referred to similarly), the elements A and B may be electrically connected to each other unless clearly described otherwise.

The control logic 12 may receive the address signal ADDR and the control command signal CMD from the external host. The address signal ADDR may include a row address indicating a row in the memory cell array 11, and a column address indicating a column in the memory cell array 11. For example, the row decoder 13 may select at least one of the plurality of wordlines WL with reference to the row address, and the column decoder 14 may select at least one of the plurality of bitlines BL with reference to the column address.

The sense amplifier 15 may include a plurality of bitline sense amplifiers connected to the memory cell array 11 through the plurality of bitlines. For example, when a read operation is performed, the bitline sense amplifier connected to a selected bitline selected by the column decoder 14 may read data from at least one of the memory cells connected to the selected bitline. The input/output circuit 16 may output data read by the bitline sense amplifier as the data signal DQ.

Each of the plurality of bitline sense amplifiers may include a plurality of P-channel Metal-Oxide-Semiconductor (PMOS) transistors and a plurality of N-channel Metal-Oxide-Semiconductor (NMOS) transistors. The plurality of PMOS transistors may provide a P-type sense amplifier, and a portion of the plurality of NMOS transistors may provide an N-type sense amplifier. A remainder of the plurality of NMOS transistors may serve as an isolation transistor, an EQ transistor, or the like. The EQ transistor may refer to an equalizer transistor in an equalizing circuit.

In an embodiment, the bitline sense amplifier may have an open bitline structure connected to a pair of bitlines. In a read operation of reading data from a selected memory cell connected to a selected bitline, which may be one of the pair of bitlines, the bitline sense amplifier may detect a voltage corresponding to a charge stored in a cell capacitor of the selected memory cell. For example, the bitline sense amplifier may first perform an offset canceling operation of compensating offset prior to a sensing operation of detecting the voltage.

The PMOS transistors included in the P-type sense amplifier may be connected to the NMOS transistors included in the N-type sense amplifier, to provide a pair of inverters. In some embodiments, offset may occur in at least one of the P-type sense amplifier or the N-type sense amplifier, due to a threshold voltage difference between the PMOS transistors and a threshold voltage difference between the NMOS transistors. Therefore, the offset canceling operation to compensate for such a threshold voltage difference may be performed first before the sensing operation.

In some embodiments, an offset component resulting from asymmetry of a layout may be minimized by arranging a plurality of transistors included in a bitline sense amplifier in a symmetrical structure. In addition, accuracy of a read operation performed by the bitline sense amplifier may be improved by compensating offset of a P-type sense amplifier and offset of an N-type sense amplifier through a plurality of operations.

Figure 2:
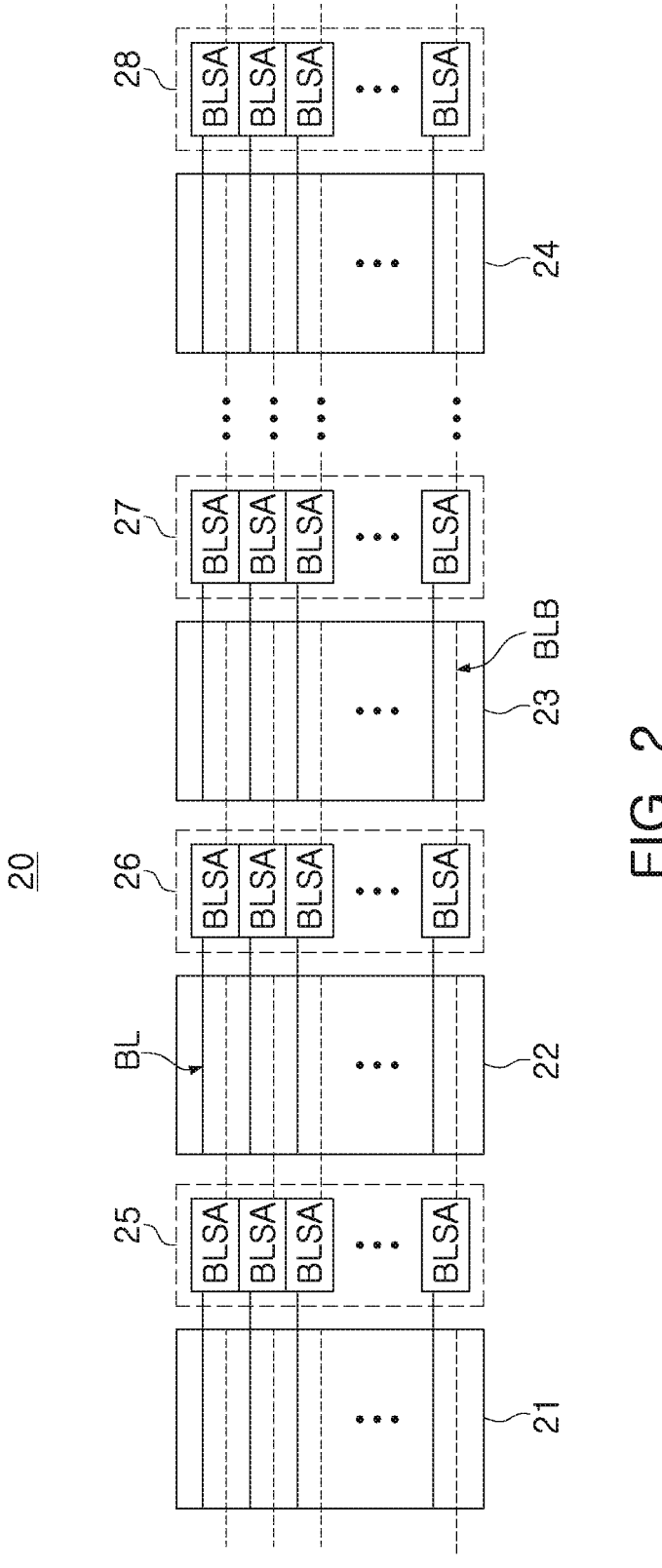
FIGS. 2 and 3 are views illustrating a structure of a semiconductor device according to some embodiments.
Figure 3:
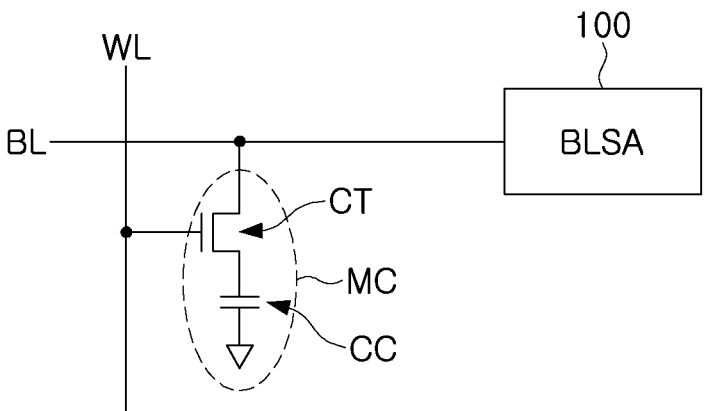

FIGS. 2 and 3 are views illustrating a structure of a semiconductor device according to some embodiments.

First, referring to FIG. 2, a semiconductor device 20 may include a plurality of sub-arrays 21 to 24 in which memory cells are respectively disposed, and a plurality of sense amplifiers 25 to 28. Each of the plurality of sense amplifiers 25 to 28 may include a plurality of bitline sense amplifiers BLSA.

As illustrated in FIG. 2, the memory cells in each of the plurality of sub-arrays 21 to 24 may be connected to at least one of bitlines BL or complementary bitlines BLB, and each of the plurality of bitline sense amplifiers BLSA may be connected to one of the bitlines BL and one of the complementary bitlines BLB. Therefore, each of the plurality of bitline sense amplifiers BLSA may be connected to the memory cells in an open bitline method.

Referring to FIG. 3, a bitline sense amplifier BLSA may be connected to a memory cell MC through a bitline BL. In some embodiments, a memory cell MC may include a switch element CT and a cell capacitor CC. Data stored in the memory cell MC may be changed depending on a charge amount of the cell capacitor CC. For example, when a state in which charges are charged in the cell capacitor CC is defined as data '1,' a state in which charges are not charged in the cell capacitor CC may be defined as data '0.'

Figure 4:
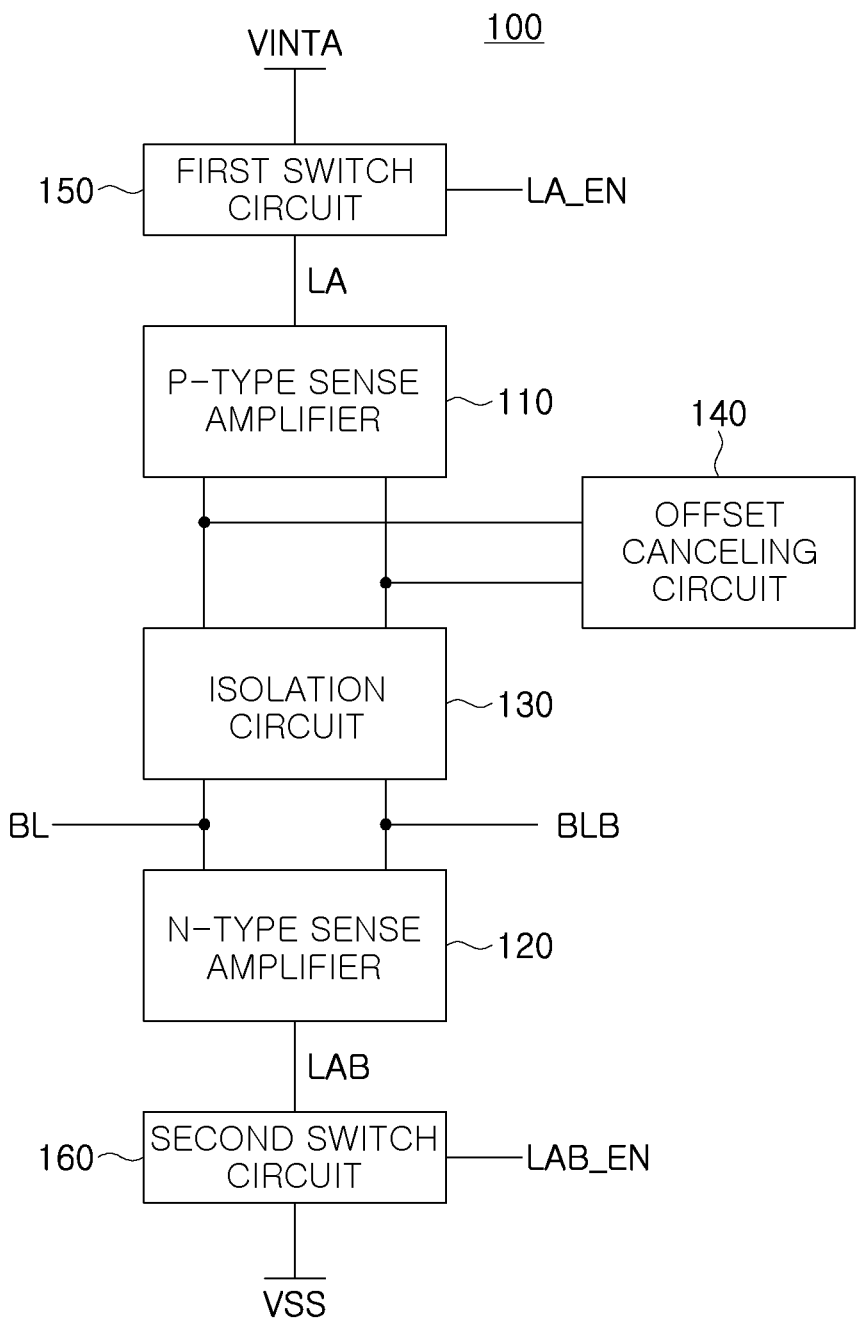
FIG. 4 is a view illustrating a bitline sense amplifier according to some embodiments.

FIG. 4 is a view illustrating a bitline sense amplifier according to some embodiments.

Referring to FIG. 4, a bitline sense amplifier 100 (corresponding to the bitline sense amplifier BLSA) according to some embodiments may include a P-type sense amplifier 110, an N-type sense amplifier 120, an isolation circuit 130, an offset canceling circuit 140, a first switch circuit 150, a second switch circuit 160, and the like. The P-type sense amplifier 110 may include a pair of PMOS transistors, and the N-type sense amplifier 120 may include a pair of NMOS transistors. The isolation circuit 130 may be connected between the P-type sense amplifier 110 and the N-type sense amplifier 120. For example, the isolation circuit 130 may be electrically connected to the P-type sense amplifier 110 and to the N-type sense amplifier 120 (e.g., electrically connected to the P-type sense amplifier 110 and to the N-type sense amplifier 120 physically between the P-type sense amplifier 110 and the N-type sense amplifier 120).

The offset canceling circuit 140 may be connected to a node between the P-type sense amplifier 110 and the isolation circuit 130. The first switch circuit 150 may control a voltage of a first sense enable line LA connected to the P-type sense amplifier 110, and the second switch circuit 160 may control a voltage of a second sense enable line LAB connected to the N-type sense amplifier 120. For example, the first switch circuit 150 may supply a first internal power source voltage VINTA to the first sense enable line LA in response to a first switch control signal LA_EN. The second switch circuit 160 may supply a second internal power source voltage VSS to the second sense enable line LAB in response to a second switch control signal LAB_EN. The number of voltages that may be supplied to the first sense enable line LA and the second sense enable line LAB, respectively, by the first switch circuit 150 and the second switch circuit 160, may be determined in various manners depending on an embodiment.

Nodes between the N-type sense amplifier 120 and the isolation circuit 130 may be assigned as input nodes, and may be connected to a bitline BL and a complementary bitline BLB. A memory cell connected to the bitline BL may be defined as a selected memory cell, and in a read operation, a turn-on voltage may be applied to a wordline connected to the selected memory cell, and the bitline sense amplifier 100 may be connected to the selected memory cell through the bitline BL.

In the read operation, an offset canceling operation may be performed first before a sensing operation of reading data from the selected memory cell. While the offset canceling operation is performed, NMOS transistors included in the isolation circuit 130 may be maintained in a turned-off state.

Afterwards, NMOS transistors included in the offset canceling circuit 140 may be turned on to perform offset compensation for the N-type sense amplifier 120 first, and then offset compensation for the P-type sense amplifier 110 may be performed. As such, in an embodiment, offset of the bitline sense amplifier 100 may be effectively canceled by compensating for offset of the P-type sense amplifier 110 and offset of the N-type sense amplifier 120 in operations, and accuracy of the read operation using the bitline sense amplifier 100 may be improved.

Figure 5A:
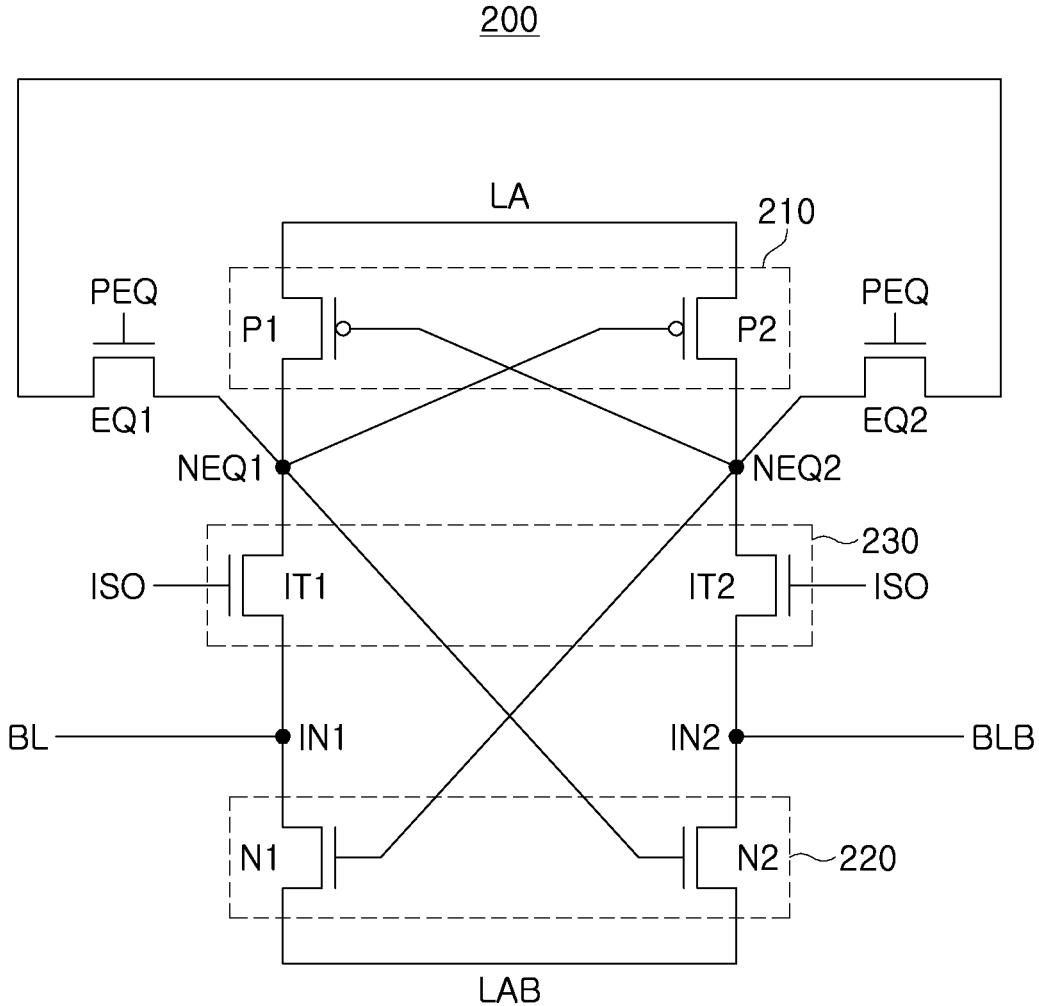
FIGS. 5A and 5B are circuit diagrams illustrating a bitline sense amplifier according to some embodiments.
Figure 5B:
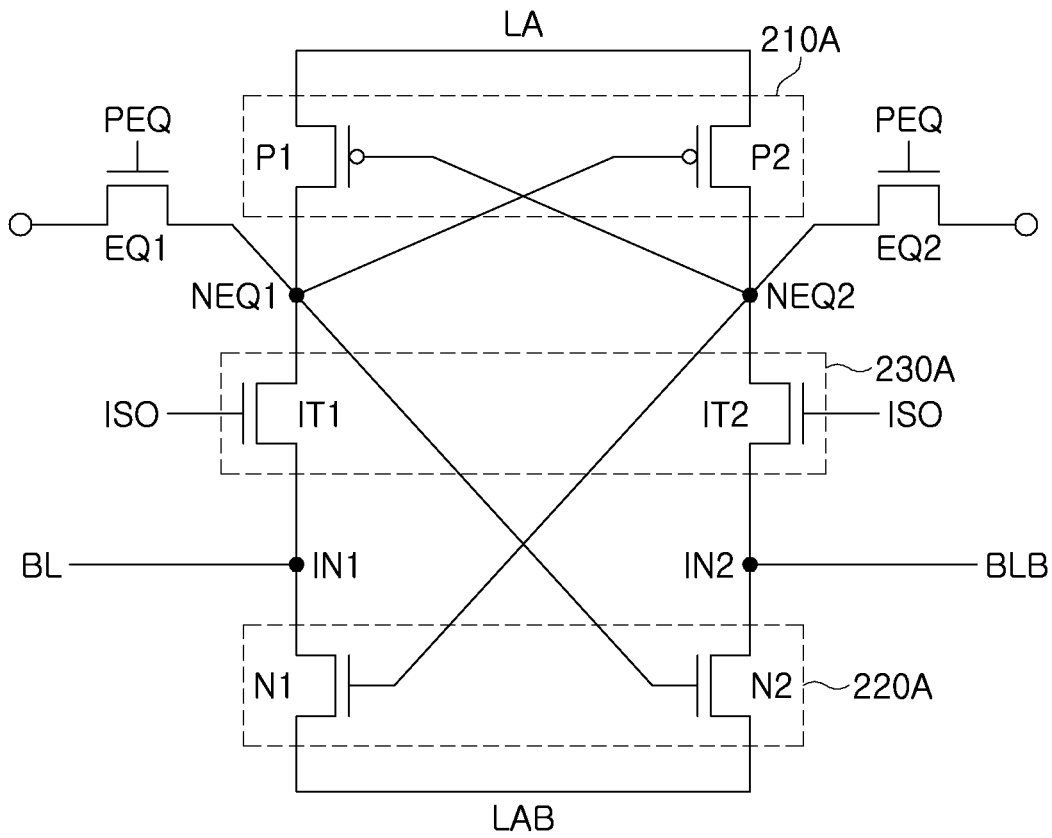

FIGS. 5A and 5B are circuit diagrams illustrating a bitline sense amplifier according to some embodiments.

First, referring to FIG. 5A, a bitline sense amplifier 200 (corresponding to the bitline sense amplifier BLSA) according to some embodiments may include a P-type sense amplifier 210, an N-type sense amplifier 220, an isolation circuit 230, and the like. The P-type sense amplifier 210 may include a first PMOS transistor P1 and a second PMOS transistor P2, and the N-type sense amplifier 220 may include a first NMOS transistor N1 and a second NMOS transistor N2.

The isolation circuit 230 may include a first isolation transistor IT1 and a second isolation transistor IT2, connected between the P-type sense amplifier 210 and the N-type sense amplifier 220. The first isolation transistor IT1 may be connected between the first NMOS transistor N1 and the first PMOS transistor P1, and the second isolation transistor IT2 may be connected between the second NMOS transistor N2 and the second PMOS transistor P2. For example, the first isolation transistor IT1 may be electrically connected to the first NMOS transistor N1 and to the first PMOS transistor P1 (e.g., electrically connected to the first NMOS transistor N1 and to the first PMOS transistor P1 physically between the first NMOS transistor N1 and the first PMOS transistor P1), and the second isolation transistor IT2 may be electrically connected to the second NMOS transistor N2 and to the second PMOS transistor P2 (e.g., electrically connected to the second NMOS transistor N2 and to the second PMOS transistor P2 physically between the second NMOS transistor N2 and the second PMOS transistor P2).

For example, the first isolation transistor IT1 may be connected to the first NMOS transistor N1 at a first input node IN1, and the second isolation transistor IT2 may be connected to the second NMOS transistor N2 at a second input node IN2. The first input node IN1 may be a node to which a bitline BL is connected, and the second input node IN2 may be a node to which a complementary bitline BLB is connected. The first NMOS transistor N1 may be connected between the first input node IN1 and a second sense enable line LAB, and the second NMOS transistor N2 may be connected between the second input node IN2 and the second sense enable line LAB.

The first isolation transistor IT1 may be connected to the first PMOS transistor P1 at a first EQ (equalizer) node NEQ1, and the second isolation transistor IT2 may be connected to the second PMOS transistor P2 at a second EQ (equalizer) node NEQ2. The first EQ node NEQ1 may be connected to a first EQ (equalizer) transistor EQ1, and the second EQ node NEQ2 may be connected to a second EQ (equalizer) transistor EQ2. The first PMOS transistor P1 may be connected between the first EQ node NEQ1 and a first sense enable line LA, and the second PMOS transistor P2 may be connected between the second EQ node NEQ2 and the first sense enable line LA.

The first EQ transistor EQ1 and the second EQ transistor EQ2 may be transistors provided to compensate offset of the P-type sense amplifier 210 and offset of the N-type sense amplifier 220 in the bitline sense amplifier 200. In the embodiment described with reference to FIG. 5A, a drain of the first EQ transistor EQ1 and a drain of the second EQ transistor EQ2 may be connected (e.g., directly connected) to each other. A source of the first EQ transistor EQ1 may be connected to the first EQ node NEQ1, and a source of the second EQ transistor EQ2 may be connected to the second EQ node NEQ2. Additionally, an equalizing signal PEQ may be (commonly) input to a gate of the first EQ transistor EQ1 and a gate of the second EQ transistor EQ2. Therefore, the first EQ transistor EQ1 and the second EQ transistor EQ2 may be turned on or off together.

Referring to FIG. 5B, a bitline sense amplifier 200A (corresponding to the bitline sense amplifier BLSA) may include a P-type sense amplifier 210A, an N-type sense amplifier 220A, an isolation circuit 230A, and the like. A connection structure between the P-type sense amplifier 210A, the N-type sense amplifier 220A, and the isolation circuit 230A may be similar to that previously described with reference to FIG. 5A.

In the embodiment illustrated in FIG. 5B, a drain of a first EQ transistor EQ1 and a drain of a second EQ transistor EQ2 may be isolated (e.g., electrically separated or electrically disconnected) from each other. Like the embodiment described with reference to FIG. 5A, in the embodiment illustrated in FIG. 5B, the first EQ transistor EQ1 and the second EQ transistor EQ2 may be turned on or off together by an equalizing signal PEQ.

Operations of the bitline sense amplifiers 200 and 200A according to the embodiments described with reference to FIGS. 5A and 5B may be controlled by a signal generated in a control logic of a semiconductor device. For example, as in the embodiment previously described with reference to FIG. 1, signals generated in a control logic 12 may be transmitted to a sense amplifier 15, to control on-off switching of at least one of transistors included in the bitline sense amplifiers 200 and 200A. For example, the on-off switching of the first and second EQ transistors EQ1 and EQ2 and on-off switching of first and second isolation transistors IT1 and IT2 may be controlled by the signals generated in the control logic 12.

Figure 6:
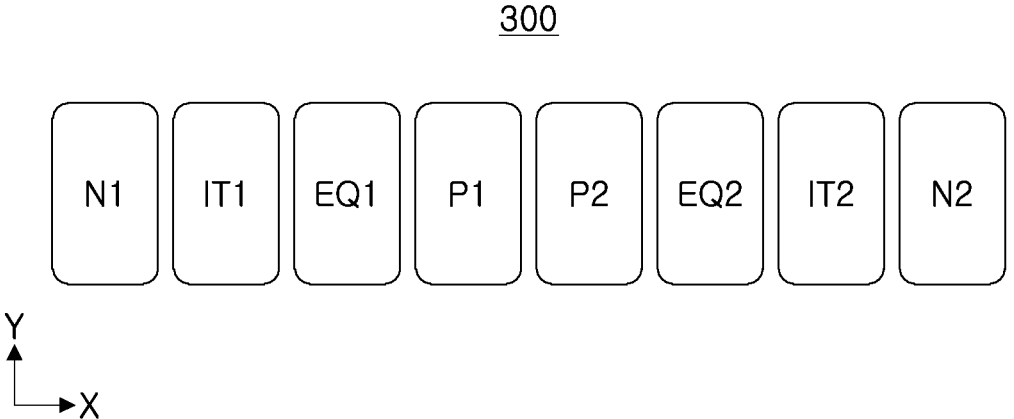
FIG. 6 is a view illustrating arrangement of elements included in a bitline sense amplifier according to some embodiments.

FIG. 6 is a view illustrating arrangement of elements included in a bitline sense amplifier according to some embodiments.

FIG. 6 is a view illustrating arrangement of elements, a first PMOS transistor P1 ("P1"), a second PMOS transistor P2 ("P2"), a first NMOS transistor N1 ("N1"), a second NMOS transistor N2 ("N2"), a first isolation transistor IT1 ("IT1"), a second isolation transistor IT2 ("IT2"), a first EQ transistor EQ1 ("EQ1"), and an second EQ transistor EQ2 ("EQ2"), included in a bitline sense amplifier 300 (corresponding to the bitline sense amplifier BLSA). Referring to FIG. 6, in a first direction (X-axis direction), the first NMOS transistor N1, the first isolation transistor IT1, the first EQ transistor EQ1, the first PMOS transistor P1, the second PMOS transistor P2, the second EQ transistor EQ2, the second isolation transistor IT2, and the second NMOS transistor N2 may be arranged in order. Depending on an embodiment, arrangement order of the first isolation transistor IT1 and the first EQ transistor EQ1 and/or arrangement order of the second EQ transistor EQ2 and the second isolation transistor IT2 may be changed. For example, the bitline sense amplifier 300 may include the first PMOS transistor P1, the second PMOS transistor P2, the first NMOS transistor N1, the second NMOS transistor N2, the first isolation transistor IT1, the second isolation transistor IT2, the first EQ transistor EQ1, and the second EQ transistor EQ2 that are arranged in the first direction (e.g., X-axis direction) in a region of a substrate. The first direction may be parallel with an upper surface of the substrate.

As previously described with reference to FIGS. 5A and 5B, in an embodiment, the eight elements included in the bitline sense amplifier 300 may include two PMOS transistors P1 and P2 and six NMOS transistors N1, N2, IT1, IT2, EQ1, and EQ2. In an embodiment, in a region in which the elements P1, P2, N1, N2, IT1, IT2, EQ1, and EQ2 of the bitline sense amplifier 300 are disposed, a P-well region for forming the NMOS transistors N1, N2, IT1, IT2, EQ1, and EQ2 may be disposed on both (opposite) sides in the first direction, and an N-well region for forming the PMOS transistors P1 and P2 may be disposed therebetween.

Therefore, as illustrated in FIG. 6, the elements P1, P2, N1, N2, IT1, IT2, EQ1, and EQ2 included in the bitline sense amplifier 300 may be arranged in a left-right symmetry (e.g., a symmetry in the first direction). The elements P1, P2, N1, N2, IT1, IT2, EQ1, and EQ2 may be arranged in a left-right symmetry to reduce offset occurring in a layout, to improve performance of the bitline sense amplifier 300. For example, P1 and P2, EQ1 and EQ2, IT1 and IT2, and N1 and N2 may be symmetrically positioned in the first direction in the bitline sense amplifier 300, respectively.

Figure 7A:
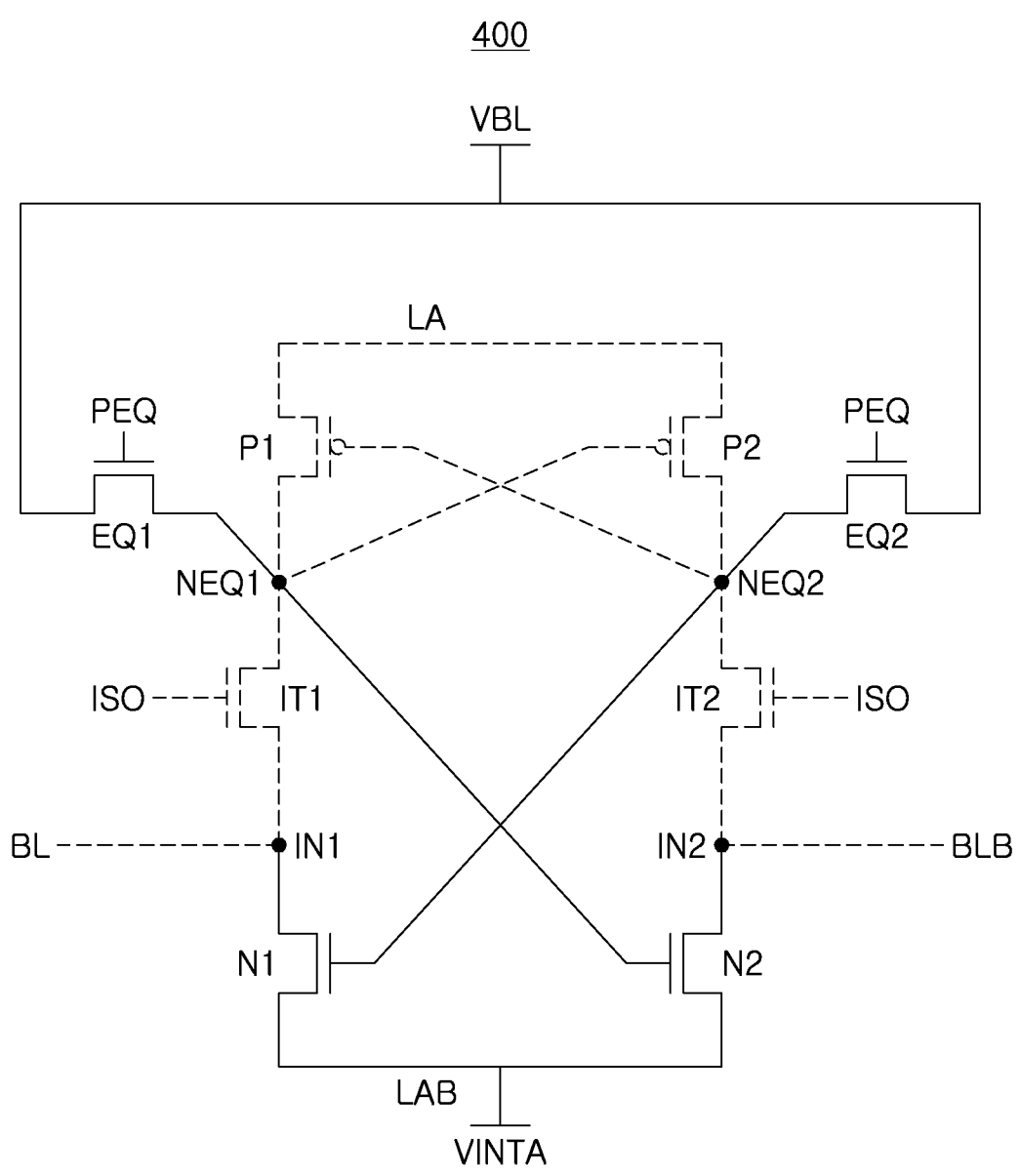
FIGS. 7A, 7B, and 7C are views illustrating an operation of a semiconductor device according to some embodiments.
Figure 7B:
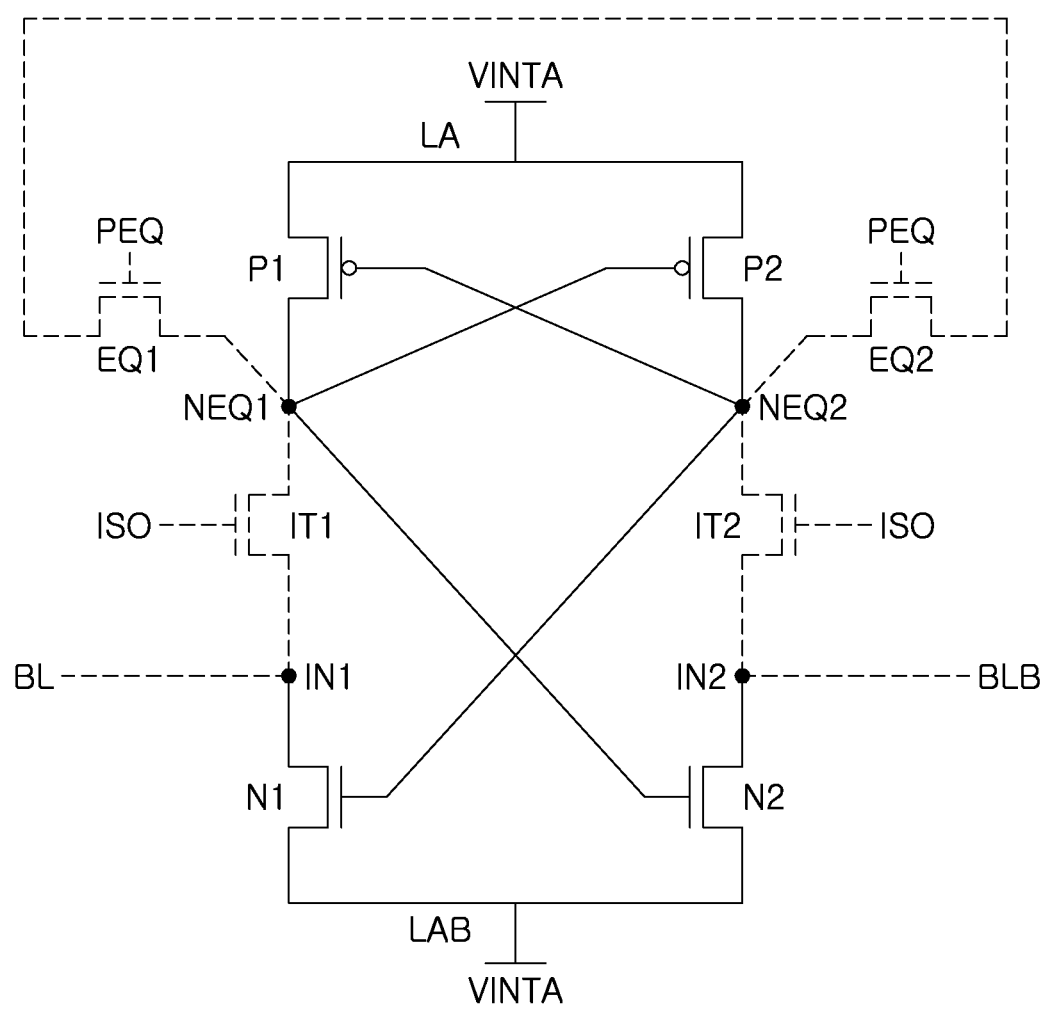
Figure 7C:
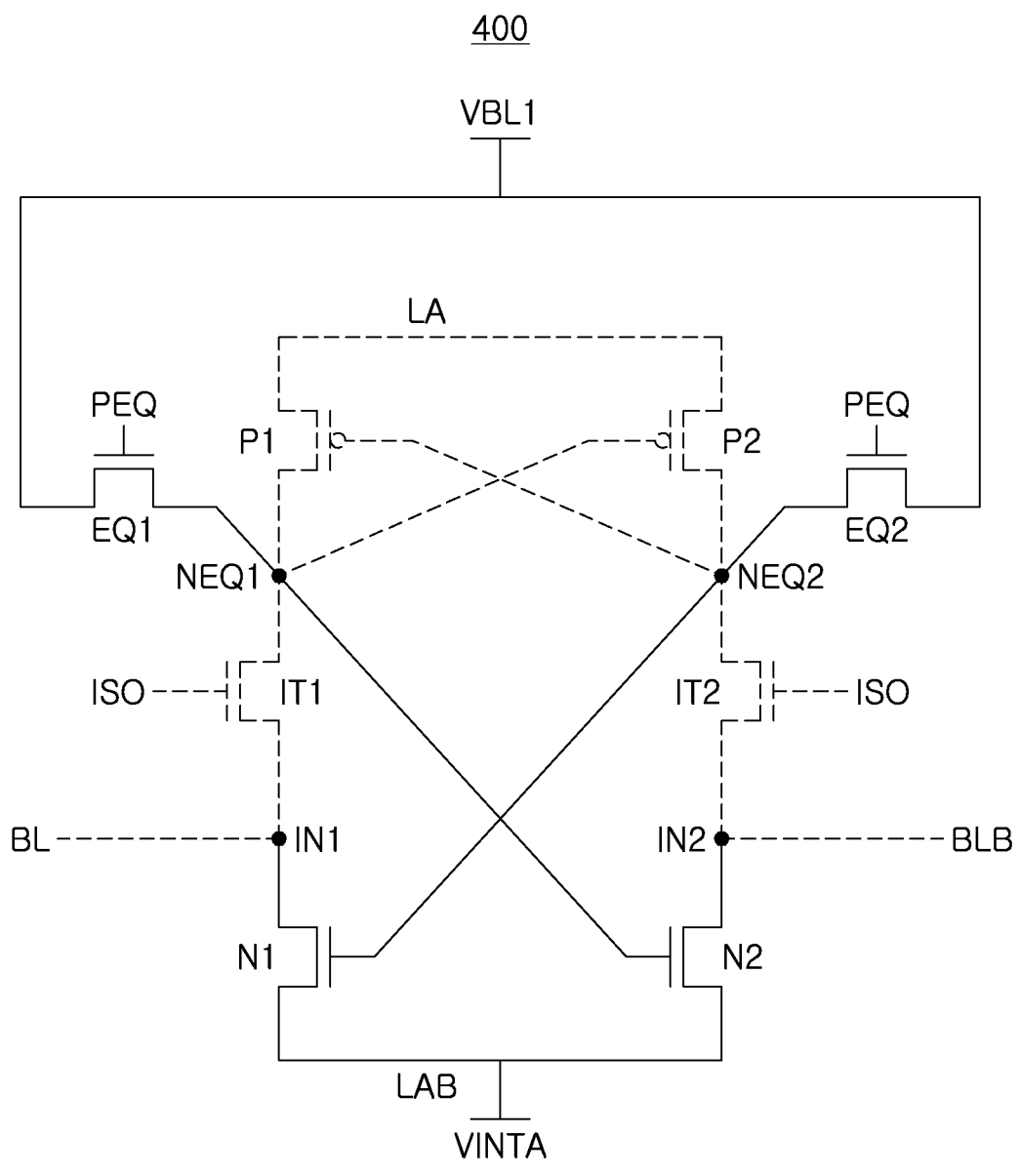

FIGS. 7A, 7B, and 7C are views illustrating an operation of a semiconductor device according to some embodiments.

A bitline sense amplifier 400 (corresponding to the bitline sense amplifier BLSA) of which operation is described with reference to FIGS. 7A, 7B, and 7C may have the same structure as the embodiment previously described with reference to FIG. 5A. FIGS. 7A, 7B, and 7C are views illustrating an operation in which control logic compensates the offset of the bitline sense amplifier 400. FIGS. 7A, 7B, and 7C may correspond to first to third offset canceling operations in order.

Hereinafter, for convenience of explanation, threshold voltages of first and second PMOS transistors P1 and P2 may be defined as VTHP1 and VTHP2, respectively, and threshold voltages of first and second NMOS transistors N1 and N2 may be defined as VTHN1 and VTHN2, respectively. VTHP1, VTHP2, VTHN1, and VTHN2 may represent magnitudes of the threshold voltages, regardless of signs of the threshold voltages of the transistors P1, P2, N1, and N2, respectively.

A control logic (e.g., the control logic 12 in FIG. 1) may set an equalizing signal PEQ to have a high level and an isolation control signal ISO to have a low level, to perform a first offset canceling operation. Therefore, as illustrated in FIG. 7A, first and second isolation transistors IT1 and IT2 may be turned off, and first and second EQ transistors EQ1 and EQ2 may be turned on. A precharge voltage VBL may be input to gates of first and second NMOS transistors N1 and N2 included in an N-type sense amplifier (e.g., the N-type sense amplifier 120, 220, or 220A), respectively, by the first and second EQ transistors EQ1 and EQ2.

A first internal power source voltage VINTA may be input to a second sense enable line LAB. A level of the first internal power source voltage VINTA may be higher than a level of the precharge voltage VBL. While the first offset canceling operation may be in progress, the first and second NMOS transistors N1 and N2 may operate in a saturation region, and a voltage of a first input node IN1 and a voltage of a second input node IN2 may be developed, to compensate for offset of the N-type sense amplifier.

For example, before the first offset canceling operation is performed, voltages of first and second EQ nodes NEQ1 and NEQ2 and the voltages of the first and second input nodes IN1 and IN2 may be set as the precharge voltage VBL. Thereafter, as illustrated in FIG. 7A, when the first and second isolation transistors IT1 and IT2 are turned off, the voltage of the first input node IN1 to which a bitline BL is connected may be developed as [VBL-VTHN1], and the voltage of the second input node IN2 to which a complementary bitline BLB is connected may be developed as [VBL-VTHN2].

For example, assuming that a threshold voltage of the second NMOS transistor N2 is greater than a threshold voltage of the first NMOS transistor N1, the voltage of the first input node IN1 may be developed to be higher than the voltage of the second input node IN2. In this manner, a difference between the threshold voltage of the first NMOS transistor N1 and the threshold voltage of the second NMOS transistor N2 may be reflected in the voltage of the first input node IN1 and the voltage of the second input node IN2, to compensate for the offset of the N-type sense amplifier.

Next, a control logic may set an equalizing signal PEQ to have a low level and an isolation control signal ISO to have a low level, to perform a second offset canceling operation. Therefore, as illustrated in FIG. 7B, first and second EQ transistors EQ1 and EQ2 and first and second isolation transistors IT1 and IT2 may be turned off. Additionally, in the second offset canceling operation, a first internal power source voltage VINTA may be input to both a first sense enable line LA and a second sense enable line LAB.

Assuming that an absolute value of a threshold voltage of a first PMOS transistor P1 is greater than an absolute value of a threshold voltage of a second PMOS transistor P2, the first PMOS transistor P1 may be saturated first. Even after the first PMOS transistor P1 is saturated, the second PMOS transistor P2 may remain turned on for a while.

By the second offset canceling operation, a voltage of a first EQ node NEQ1 may be developed as [VINTA-VTHP1], and a voltage of a second EQ node NEQ2 may be developed as [VINTA-VTHP2]. Additionally, a voltage of a first input node IN1 may be developed as [VINTA-VTHP2-VTHN1], and a voltage of a second input node IN2 may be developed as [VINTA-VTHP1-VTHN2]. To resolve voltage imbalance between the first EQ node NEQ1 and the second EQ node NEQ2, a third offset canceling operation may be additionally performed.

A control logic may set an equalizing signal PEQ to have a high level and an isolation control signal ISO to have a low level, to perform a third offset removal operation. Therefore, as illustrated in FIG. 7C, first and second EQ transistors EQ1 and EQ2 may be turned on, and first and second isolation transistors IT1 and IT2 may be turned off. Additionally, a first sense enable line LA may be floating.

The first and second EQ transistors EQ1 and EQ2 may supply a bias voltage VBL1 to first and second EQ nodes NEQ1 and NEQ2, and voltages of the first and second EQ nodes NEQ1 and NEQ2 may be set as the bias voltage VBL1. Therefore, a voltage of a first input node IN1 may be developed as [VBL1-VTHN1], and a voltage of a second input node IN2 may be developed as [VBL1-VTHN2]. In an embodiment, a level of the bias voltage VBL1 may be higher than a level of a precharge voltage VBL, and may be lower than a level of a first internal power source voltage VINTA.

When the first to third offset canceling operations are completed, a control logic may connect a bitline BL to a selected memory cell to perform a charge sharing operation, and a sensing operation of reading an amount of charges stored in a cell capacitor of the selected memory cell, and a precharge operation of resetting a voltage of the bitline BL and a voltage of a complementary bitline BLB to a precharge voltage VBL may be performed in order. The charge sharing operation, the sensing operation, and the precharge operation will be described later.

Figure 8A:
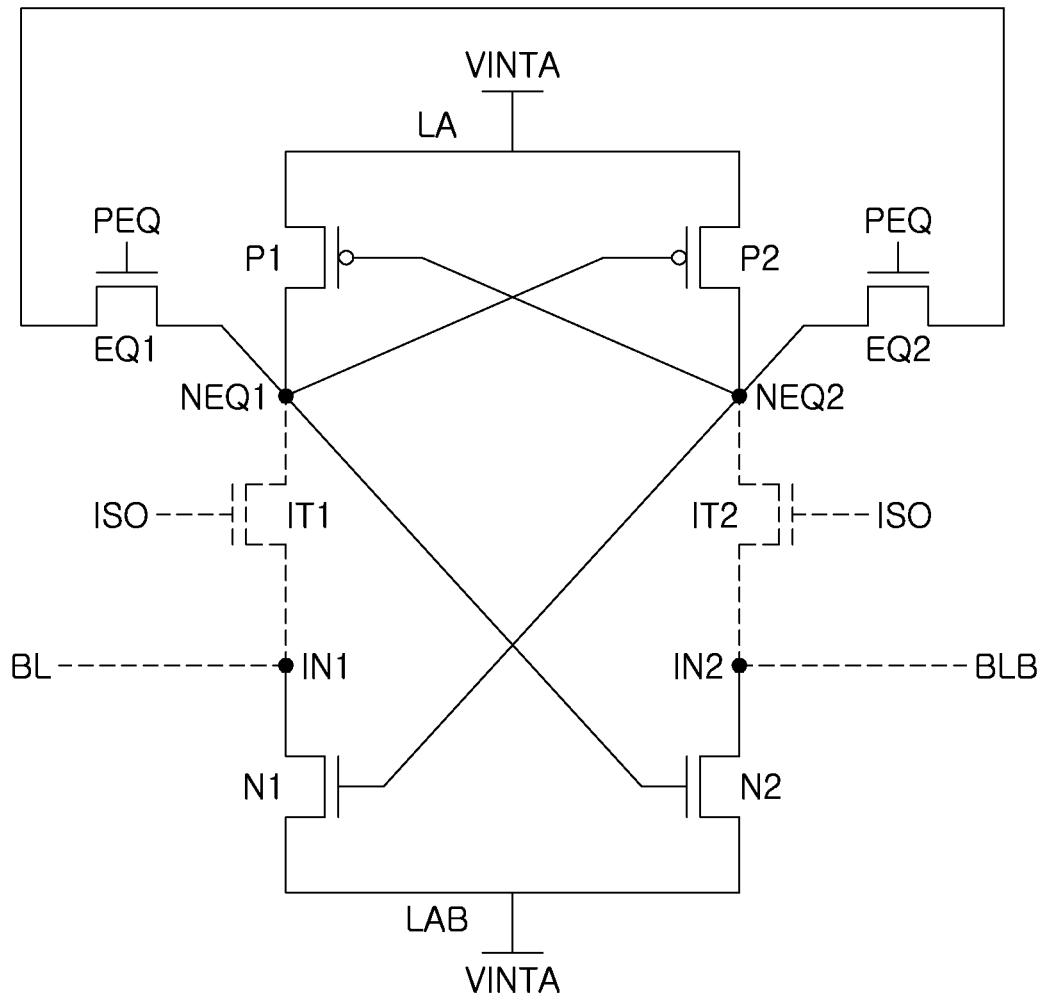
FIGS. 8A, 8B, and 8C are views illustrating an operation of a semiconductor device according to some embodiments.
Figure 8B:
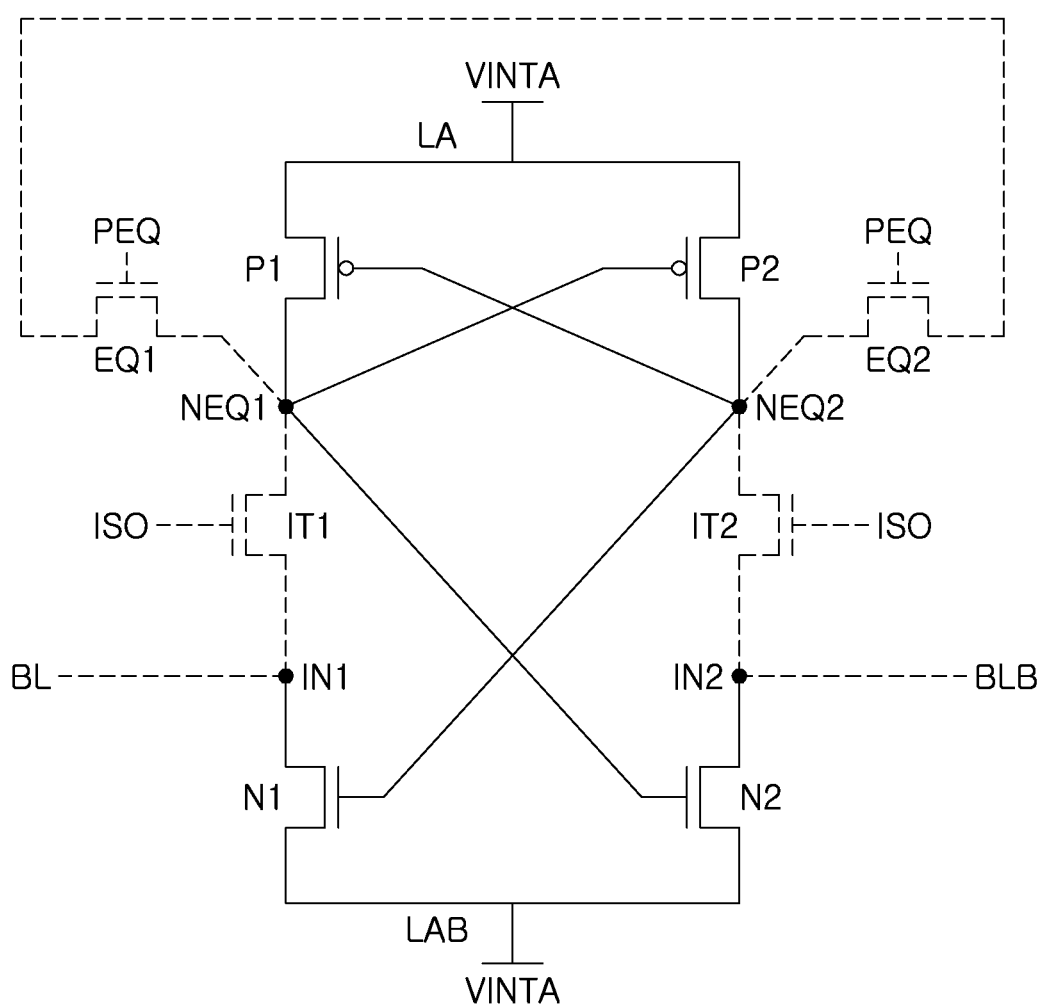
Figure 8C:
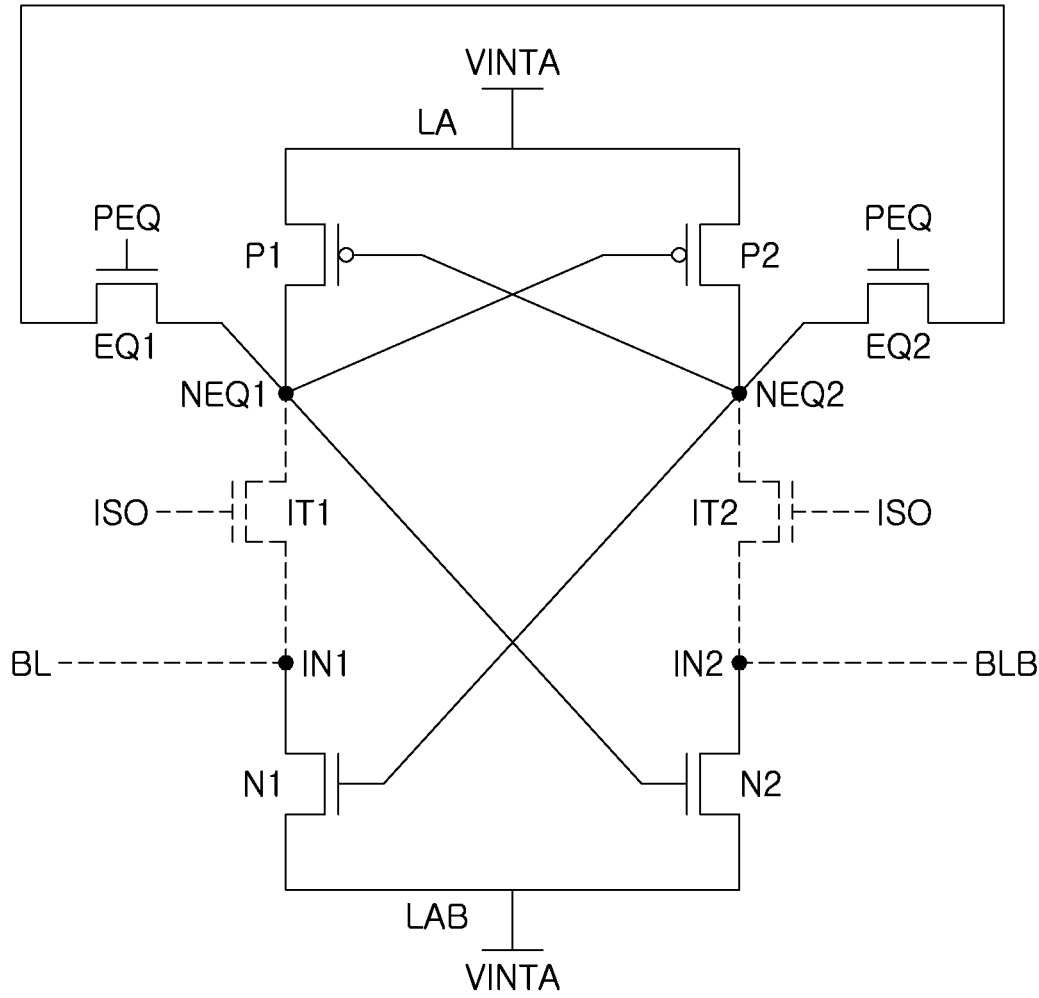

FIGS. 8A, 8B, and 8C are views illustrating an operation of a semiconductor device according to an embodiment.

FIGS. 8A, 8B, and 8C may correspond to first, second, and third offset canceling operations in order. A control logic may control a bitline sense amplifier 400 (corresponding to the bitline sense amplifier BLSA) to execute the first to third offset canceling operations. As previously described with reference to FIGS. 7A, 7B, and 7C, levels of threshold voltages of first and second PMOS transistors P1 and P2 may be defined as VTHP1 and VTHP2, respectively, and levels of threshold voltages of first and second NMOS transistors N1 and N2 may be defined as VTHN1 and VTHN2, respectively.

A control logic may (e.g., the control logic 12 in FIG. 1) set an equalizing signal PEQ to have a high level and an isolation control signal ISO to have a low level, to perform a first offset canceling operation. Therefore, as illustrated in FIG. 8A, first and second isolation transistors IT1 and IT2 may be turned off, and first and second EQ transistors EQ1 and EQ2 may be turned on. The first and second EQ transistors EQ1 and EQ2 may provide a connection path between a first EQ node NEQ1 and a second EQ node NEQ2. Unlike the embodiment described with reference to FIG. 7A, a voltage may not be applied to drains of the first and second EQ transistors EQ1 and EQ2.

In the first offset canceling operation, the control logic may input a first internal power source voltage VINTA to a first sense enable line LA and a second sense enable line LAB, respectively. Since the first EQ node NEQ1 and the second EQ node NEQ2 are connected to each other, a voltage of the first EQ node NEQ1 and a voltage of the second EQ node NEQ2 may be developed to have the same level. Since the first EQ node NEQ1 is connected to the second NMOS transistor N2 and the second EQ node NEQ2 is connected to the first NMOS transistor N1, the first NMOS transistor N1 and the second NMOS transistor N2 may operate in a saturation region to compensate for offset of an N-type sense amplifier (e.g., the N-type sense amplifier 120, 220, or 220A). For example, assuming that the voltages of the first EQ node NEQ1 and the second EQ node NEQ2 are developed as [VEQ], a voltage of a first input node IN1 may be developed as [VEQ-VTHN1], and a voltage of a second input node IN2 may be developed as [VEQ-VTHN2]. The voltages of the first EQ node NEQ1 and the second EQ node NEQ2 may be developed to have a lower level than the first internal power source voltage VINTA.

Next, a control logic may set an equalizing signal PEQ and an isolation control signal ISO to have a low level, to perform a second offset canceling operation. Therefore, as illustrated in FIG. 8B, first and second EQ transistors EQ1 and EQ2 and first and second isolation transistors IT1 and IT2 may be turned off. Additionally, a first internal power source voltage VINTA may continue to be input to a first sense enable line LA and a second sense enable line LAB.

Since the first and second EQ transistors EQ1 and EQ2 are turned off and a first EQ node NEQ1 and a second EQ node NEQ2 are electrically isolated from each other, a voltage of the first EQ node NEQ1 and a voltage of the second EQ node NEQ2 may be developed differently. For example, the voltage of the first EQ node NEQ1 may be developed as [VINTA-VTHP1], and the voltage of the second EQ node NEQ2 may be developed as [VINTA-VTHP2]. Thereafter, to resolve voltage imbalance between the first EQ node NEQ1 and the second EQ node NEQ2, a third offset canceling operation may be additionally performed.

A control logic may set an equalizing signal PEQ to have a high level and an isolation control signal ISO to have a low level, to perform a third offset canceling operation. Therefore, as illustrated in FIG. 8C, first and second EQ transistors EQ1 and EQ2 may be turned on, and first and second isolation transistors IT1 and IT2 may be turned off. A first internal power source voltage VINTA may continue to be input to a first sense enable line LA and a second sense enable line LAB.

The first and second EQ transistors EQ1 and EQ2 may connect a first EQ node NEQ1 and a second EQ node NEQ2 to each other. Since the first EQ node NEQ1 and the second EQ node NEQ2 are connected to each other, and the first internal power source voltage VINTA is input from the first sense enable line LA through a P-type sense amplifier (e.g., the P-type sense amplifier 110, 210, or 210A), voltage imbalance between the first EQ node NEQ1 and the second EQ node NEQ2 may be resolved.

When the first to third offset canceling operations are completed, the control logic may perform a charge sharing operation and a sensing operation to read data from a selected memory cell connected to a bitline BL, and may perform a precharge operation to reset a voltage of the bitline BL and a voltage of a complementary bitline BLB as a precharge voltage. The precharge voltage may be a voltage on a lower level than the first internal power source voltage VINTA.

Figure 9A:
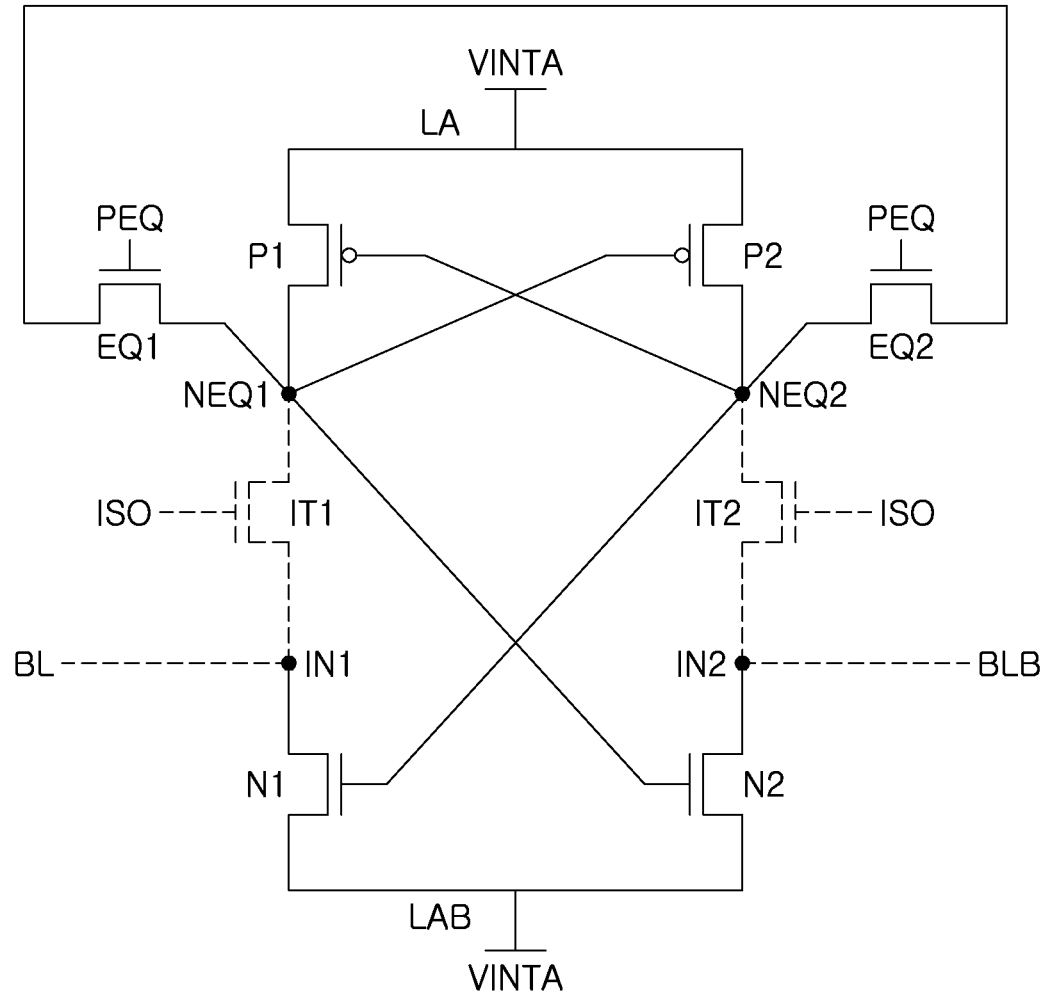
FIGS. 9A, 9B, and 9C are views illustrating an operation of a semiconductor device according to some embodiments.
Figure 9B:
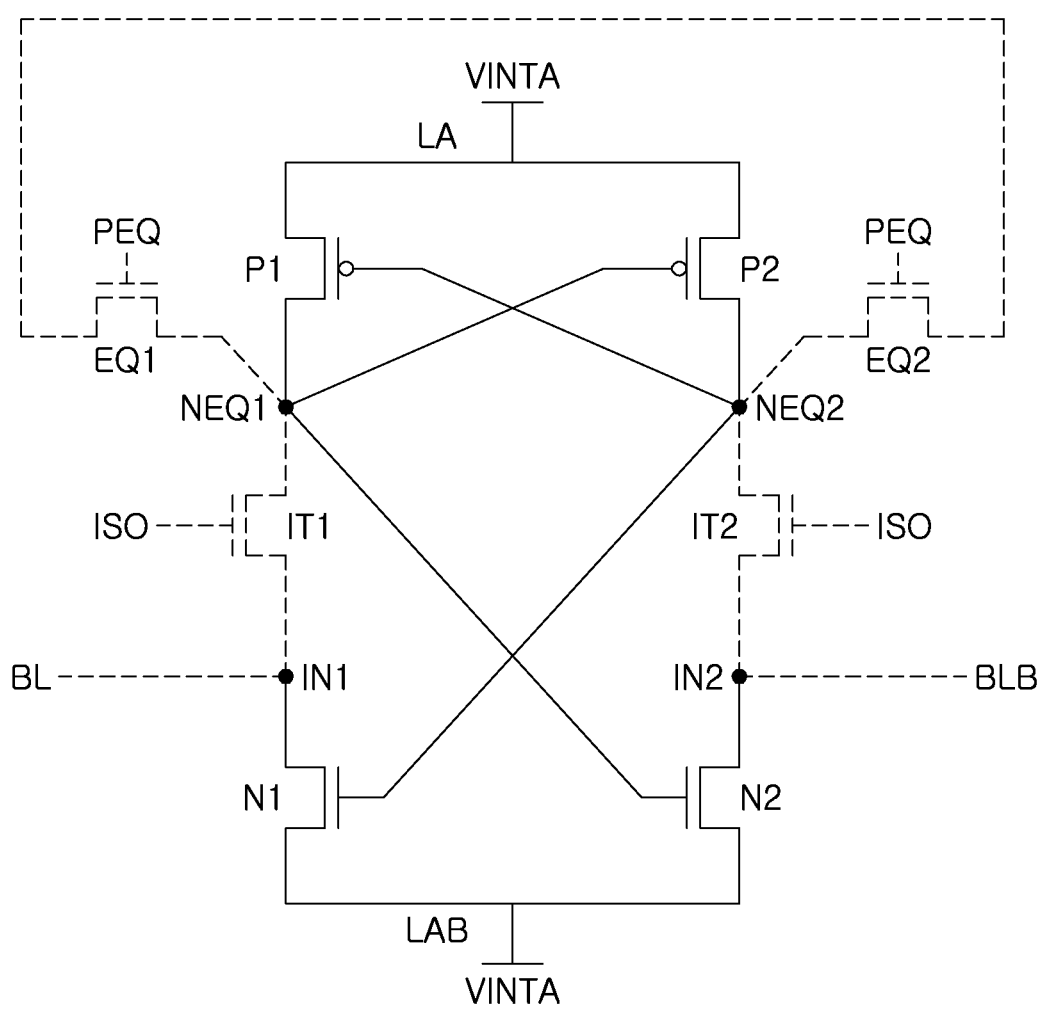
Figure 9C:
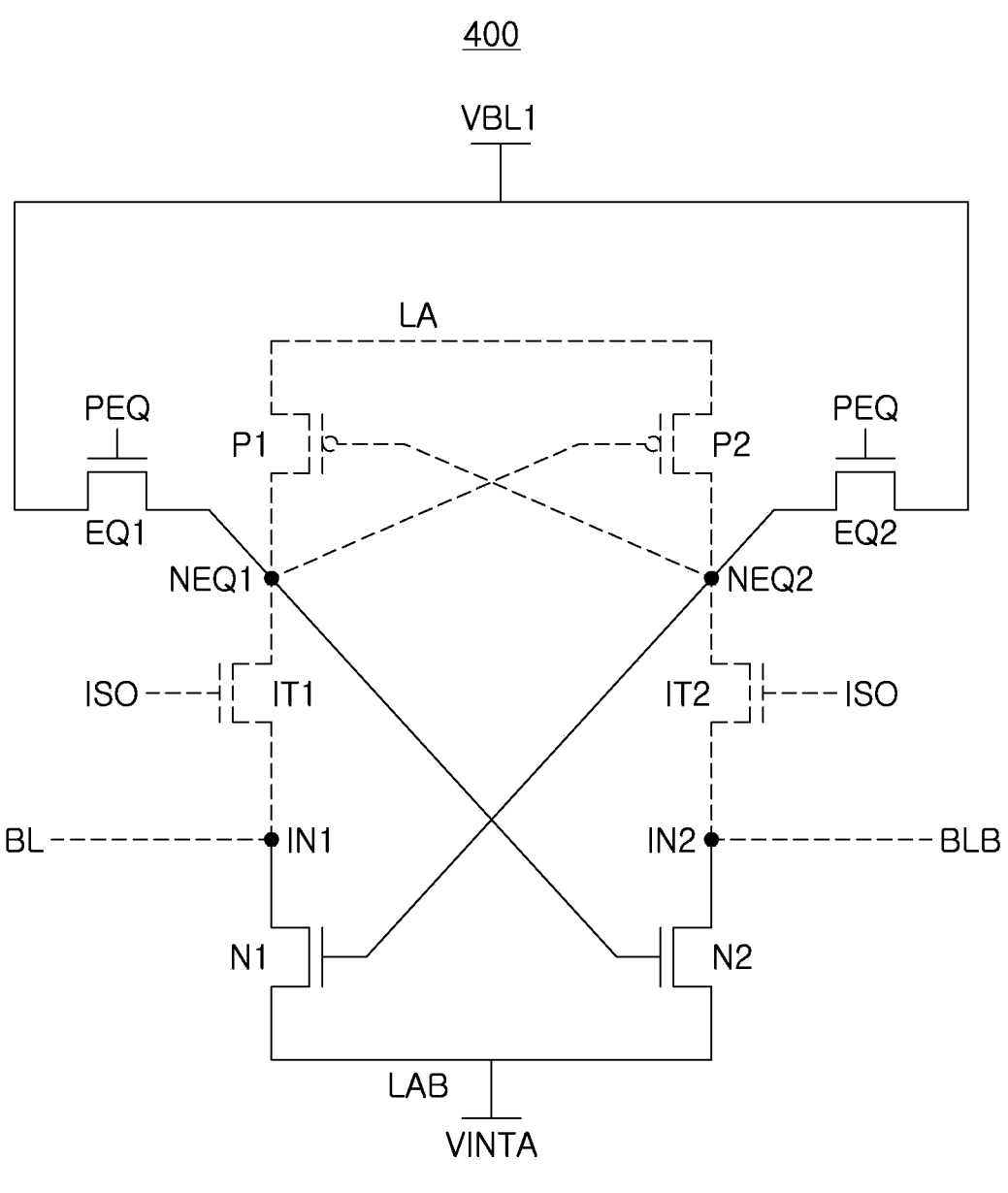

FIGS. 9A, 9B, and 9C are views illustrating an operation of a semiconductor device according to an embodiment.

FIGS. 9A, 9B, and 9C may correspond to first to third offset canceling operations in order. A control logic (e.g., the control logic 12 in FIG. 1) may control a bitline sense amplifier 400 to execute the first to third offset canceling operations. For convenience of description below, levels of threshold voltages of first and second PMOS transistors P1 and P2 may be defined as VTHP1 and VTHP2, respectively, and levels of threshold voltages of first and second NMOS transistors N1 and N2 may be defined as VTHN1 and VTHN2, respectively.

A control logic may set an equalizing signal PEQ to have a high level and an isolation control signal ISO to have a low level, to perform a first offset canceling operation. Therefore, as illustrated in FIG. 9A, first and second isolation transistors IT1 and IT2 may be turned off, and first and second EQ transistors EQ1 and EQ2 may be turned on. A first EQ node NEQ1 and a second EQ node NEQ2 may be electrically connected to each other by the first and second EQ transistors EQ1 and EQ2.

In the first offset canceling operation, the control logic may input a first internal power source voltage VINTA to a first sense enable line LA and a second sense enable line LAB, respectively. Since the first EQ node NEQ1 and the second EQ node NEQ2 are connected to each other, a voltage of the first EQ node NEQ1 and a voltage of the second EQ node NEQ2 may be developed to have the same level.

Since the first EQ node NEQ1 is connected to the second NMOS transistor N2 and the second EQ node NEQ2 is connected to the first NMOS transistor N1, the first NMOS transistor N1 and the second NMOS transistor N2 may operate in a saturation region to compensate for offset of an N-type sense amplifier (e.g., the N-type sense amplifier 120, 220, or 220A). For example, if the voltages of the first EQ node NEQ1 and the second EQ node NEQ2 are defined as being developed as [VEQ], a voltage of a first input node IN1 may be developed as [VEQ-VTHN1], and a voltage of a second input node IN2 may be developed as [VEQ-VTHN2]. The voltages of the first EQ node NEQ1 and the second EQ node NEQ2 may be developed to have a lower level than the first internal power source voltage VINTA.

Next, a control logic may set an equalizing signal PEQ and an isolation control signal ISO to have a low level, to perform a second offset canceling operation. Therefore, as illustrated in FIG. 9B, first and second EQ transistors EQ1 and EQ2 and first and second isolation transistors IT1 and IT2 may be turned off. Additionally, a first internal power source voltage VINTA may continue to be input to a first sense enable line LA and a second sense enable line LAB.

Since the first and second EQ transistors EQ1 and EQ2 are turned off and a first EQ node NEQ1 and a second EQ node NEQ2 are electrically isolated from each other, a voltage of the first EQ node NEQ1 and a voltage of the second EQ node NEQ2 may be developed differently due to a difference in threshold voltage between a first PMOS transistor P1 and a second PMOS transistor P2. For example, the voltage of the first EQ node NEQ1 may be developed as [VINTA-VTHP1], and the voltage of the second EQ node NEQ2 may be developed as [VINTA-VTHP2]. Thereafter, to resolve voltage imbalance between the first EQ node NEQ1 and the second EQ node NEQ2, a third offset canceling operation may be additionally performed.

A control logic may set an equalizing signal PEQ to have a high level and an isolation control signal ISO to have a low level, to perform a third offset canceling operation. Therefore, as illustrated in FIG. 9C, first and second EQ transistors EQ1 and EQ2 may be turned on, and first and second isolation transistors IT1 and IT2 may be turned off. A first sense enable line LA may be floating, and a first internal power source voltage VINTA may be input to a second sense enable line LAB.

The first and second EQ transistors EQ1 and EQ2 may connect a first EQ node NEQ1 and a second EQ node NEQ2 to each other, while a bias voltage VBL1 may be applied to the first EQ node NEQ1 and the second EQ node NEQ2. Therefore, a voltage of the first EQ node NEQ1 and a voltage of the second EQ node NEQ2 may be set as the bias voltage VBL1. In an embodiment, a level of the bias voltage VBL1 may be lower than a level of the first internal power source voltage VINTA.

When the first to third offset canceling operations are completed, the control logic may perform a charge sharing operation and a sensing operation to read data from a selected memory cell connected to a bitline BL, and may perform a precharge operation to reset a voltage of the bitline BL and a voltage of a complementary bitline BLB as a precharge voltage. The precharge voltage may be a voltage on a lower level than the bias voltage VBL1.

Figure 10A:
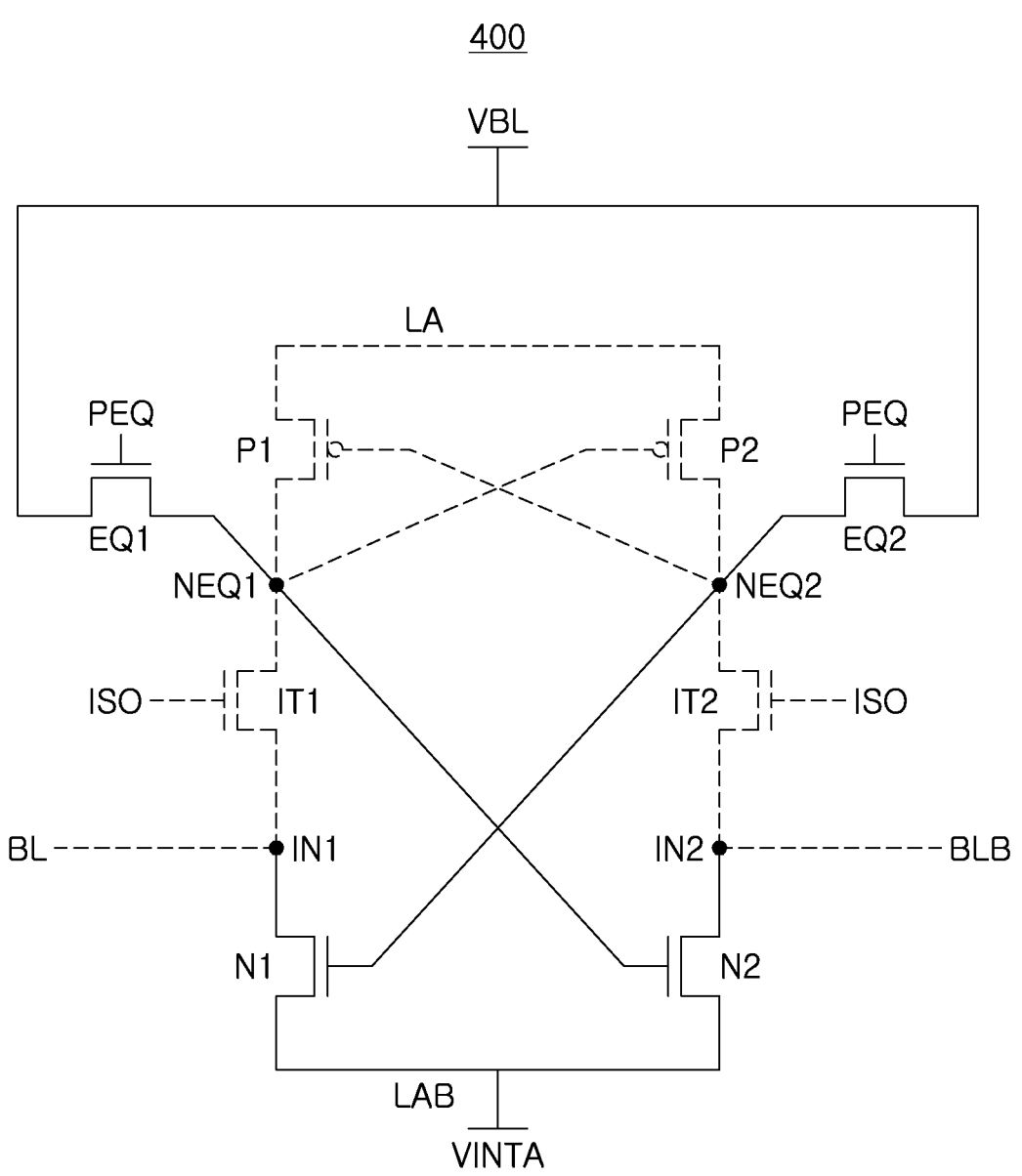
FIGS. 10A, 10B, and 10C are views illustrating an operation of a semiconductor device according to some embodiments.
Figure 10B:
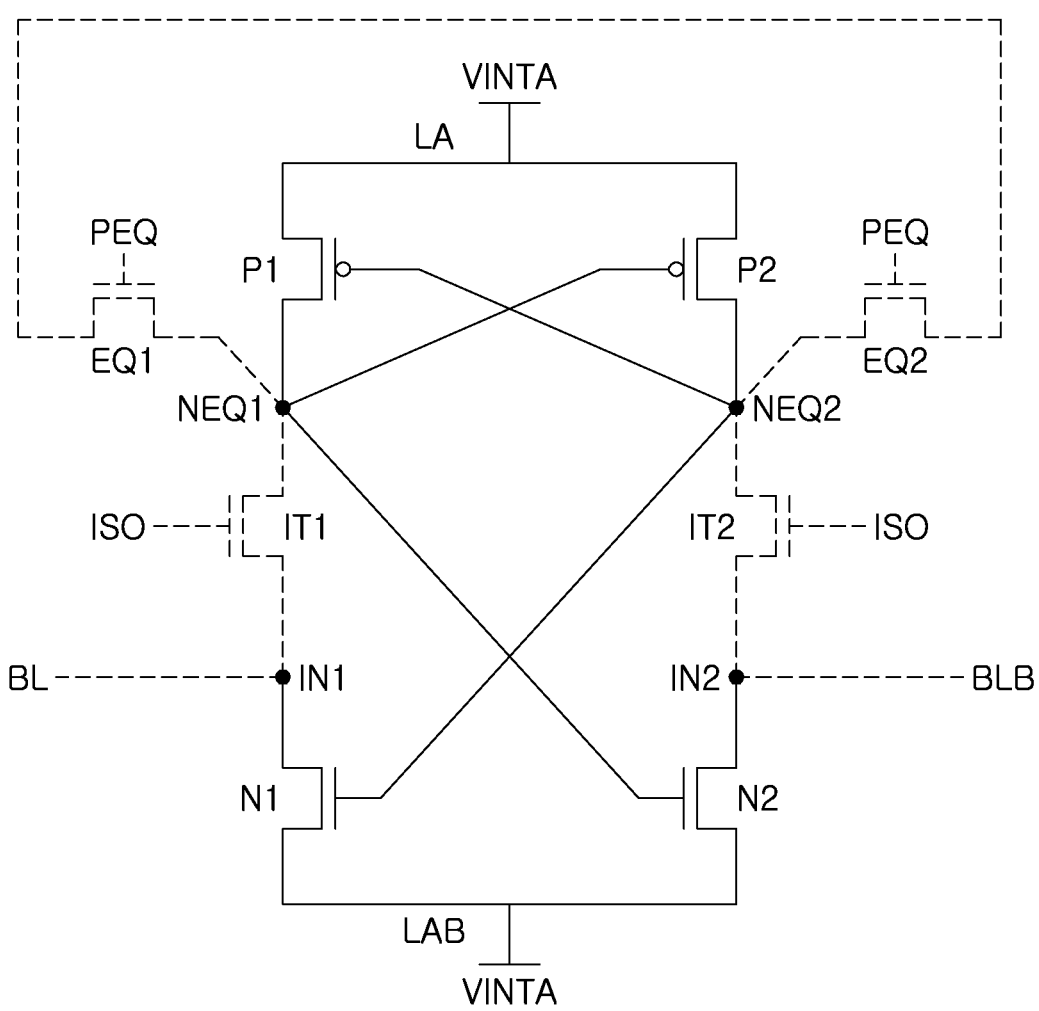
Figure 10C:
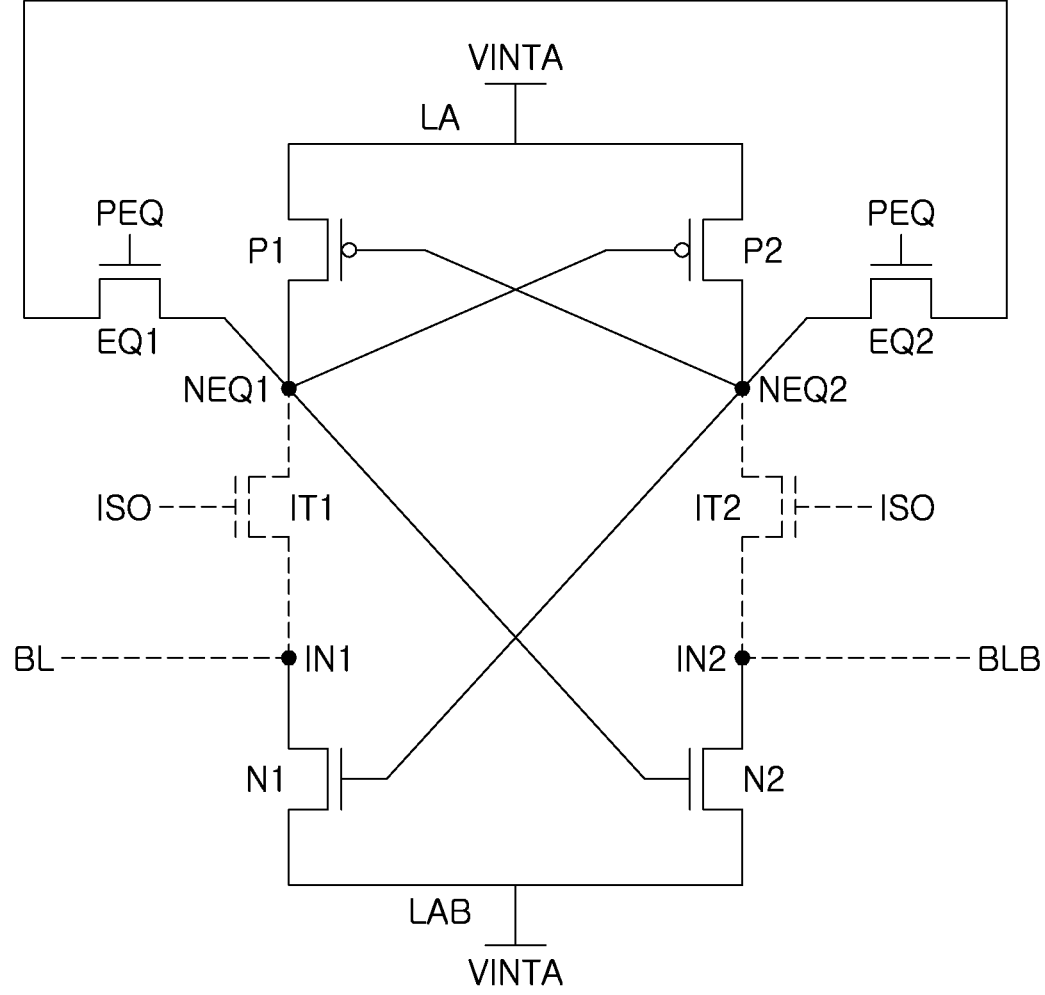

FIGS. 10A, 10B, and 10C are views illustrating an operation of a semiconductor device according to some embodiments.

FIGS. 10A, 10B, and 10C may correspond to first to third offset canceling operations in order. A control logic (e.g., the control logic 12 in FIG. 1) may control a bitline sense amplifier 400 to execute the first to third offset canceling operations. For convenience of description below, levels of threshold voltages of first and second PMOS transistors P1 and P2 may be defined as VTHP1 and VTHP2, respectively, and levels of threshold voltages of first and second NMOS transistors N1 and N2 may be defined as VTHN1 and VTHN2, respectively.

A control logic may set an equalizing signal PEQ to have a high level and an isolation control signal ISO to have a low level, to perform a first offset canceling operation. Therefore, as illustrated in FIG. 10A, first and second isolation transistors IT1 and IT2 may be turned off, and first and second EQ transistors EQ1 and EQ2 may be turned on. A precharge voltage VBL may be input to gates of the first and second NMOS transistors N1 and N2 included in an N-type sense amplifier (e.g., the N-type sense amplifier 120, 220, or 220A), respectively, by the first and second EQ transistors EQ1 and EQ2.

A first internal power source voltage VINTA may be input to the second sense enable line LAB. While the first offset canceling operation is in progress, the first and second NMOS transistors N1 and N2 may operate in a saturation region, and a voltage of a first input node IN1 and a voltage of a second input node IN2 may be developed, to compensate for offset of the N-type sense amplifier. For example, the voltage of the first input node IN1 may be developed as [VINTA-VTHN1], and the voltage of the second input node IN2 may be developed as [VINTA-VTHN2], such that a difference in threshold voltage between the first NMOS transistor N1 and the second NMOS transistor N2 may be reflected in the first input node IN1 and the second input node IN2.

Next, a control logic may set an equalizing signal PEQ and an isolation control signal ISO to have a low level, to perform a second offset canceling operation. Therefore, as illustrated in FIG. 10B, first and second EQ transistors EQ1 and EQ2 and first and second isolation transistors IT1 and IT2 may be turned off. Additionally, a first internal power source voltage VINTA may be input to a first sense enable line LA and a second sense enable line LAB. Since the first and second EQ transistors EQ1 and EQ2 are turned off and a first EQ node NEQ1 and a second EQ node NEQ2 are electrically isolated from each other, a voltage of the first EQ node NEQ1 and a voltage of the second EQ node NEQ2 may be developed differently due to a difference in threshold voltage between a first PMOS transistor P1 and a second PMOS transistor P2. For example, the voltage of the first EQ node NEQ1 may be developed as [VINTA-VTHP1], and the voltage of the second EQ node NEQ2 may be developed as [VINTA-VTHP2].

Thereafter, a control logic may set an equalizing signal PEQ to have a high level and an isolation control signal ISO to have a low level, to perform a third offset canceling operation. Therefore, as illustrated in FIG. 10C, first and second EQ transistors EQ1 and EQ2 may be turned on, and first and second isolation transistors IT1 and IT2 may be turned off. Additionally, a first internal power source voltage VINTA may be applied to a first sense enable line LA. Unlike the first offset canceling operation illustrated in FIG. 10A, a precharge voltage VBL may not be applied to drains of the first and second EQ transistors in the third offset canceling operation.

The first and second EQ transistors EQ1 and EQ2 may connect a first EQ node NEQ1 and a second EQ node NEQ2 to each other. Since the first EQ node NEQ1 and the second EQ node NEQ2 are connected to each other and the first internal power source voltage VINTA is input from the first sense enable line LA through a P-type sense amplifier (e.g., the P-type sense amplifier 110, 210, or 210A), voltage imbalance between the first EQ node NEQ1 and the second EQ node NEQ2 may be resolved.

When the first to third offset canceling operations are completed, the control logic may perform a charge sharing operation and a sensing operation to read data from a selected memory cell connected to a bitline BL, and may perform a precharge operation to reset a voltage of the bitline BL and a voltage of a complementary bitline BLB as a precharge voltage. A level of the precharge voltage VBL may be lower than a level of the first internal power source voltage VINTA.

The operations of the bitline sense amplifier 400 described with reference to FIGS. 7A, 7B, 7C, 8A, 8B, 8C, 9A, 9B, 9C, 10A, 10B, and 10C may also be applied to the bitline sense amplifier 200A having a structure previously described with reference to FIG. 5B. For example, the offset canceling operation of the bitline sense amplifier 200A according to the embodiment illustrated in FIG. 5B may be implemented according to the embodiments described with reference to FIGS. 7A, 7B, 7C, 8A, 8B, 8C, 9A, 9B, 9C, 10A, 10B, and 10C.

Figure 11:
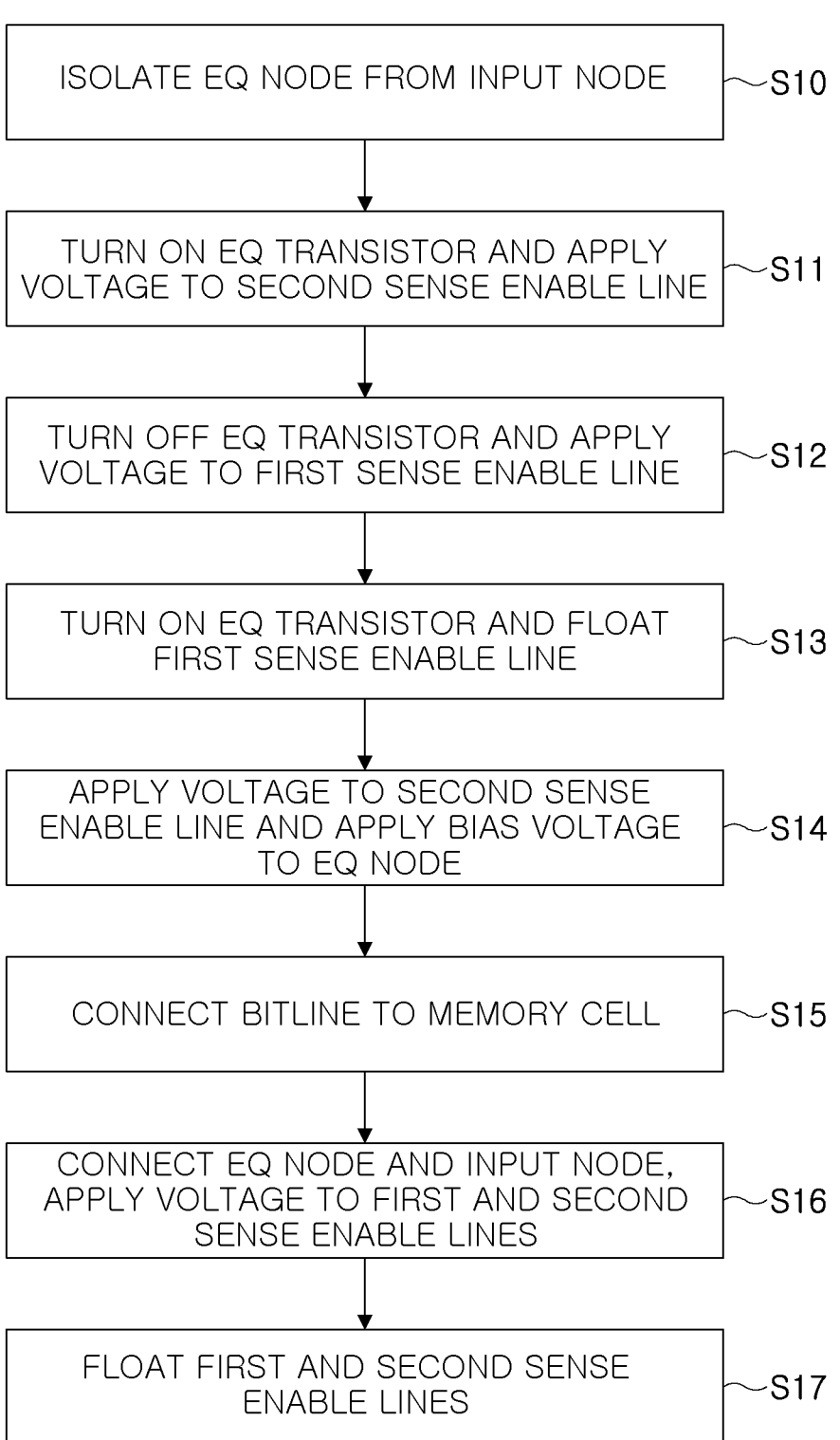
FIG. 11 is a flowchart illustrating an operation of a semiconductor device according to some embodiments.

FIG. 11 is a flowchart illustrating an operation of a semiconductor device according to some embodiments.

FIG. 11 may be a flowchart illustrating a read operation of reading data stored in a selected memory cell using a bitline sense amplifier. An operation of the bitline sense amplifier may be controlled by a control logic (e.g., the control logic 12 in FIG. 1) included in a semiconductor device. Hereinafter, for convenience of explanation, the read operation will be described with reference to FIG. 5A.

First, in a bitline sense amplifier 200, first and second EQ nodes NEQ1 and NEQ2 and first and second input nodes IN1 and IN2 may be isolated (e.g., electrically isolated) from each other (S10). A control logic may turn off the first and second isolation transistors IT1 and IT2 to isolate the first EQ node NEQ1 from the first input node IN1 and isolate the second EQ node NEQ2 from the second input node IN2. Before the first and second EQ nodes NEQ1 and NEQ2 and the first and second input nodes IN1 and IN2 are isolated from each other, a bitline BL and a complementary bitline BLB may be set to have a precharge voltage, respectively.

Afterwards, first and second EQ transistors EQ1 and EQ2 may be turned on, and a voltage may be applied to a second sense enable line LAB (S11). As the first and second EQ transistors EQ1 and EQ2 are turned on, the first EQ node NEQ1 and the second EQ node NEQ2 may be connected to each other. A first internal power source voltage higher than the precharge voltage may be applied to the second sense enable line LAB, and a first sense enable line LA may be floating. In S11, offset of an N-type sense amplifier (e.g., the N-type sense amplifier 220A) may be reflected in a voltage of the first input node IN1 and a voltage of the second input node IN2, respectively.

Next, the first and second EQ transistors EQ1 and EQ2 may be turned off to electrically isolate the first EQ node NEQ1 and the second EQ node NEQ2, and the first internal power source voltage may be applied to the first sense enable line LA (S12). Therefore, offset of a P-type sense amplifier (e.g., the P-type sense amplifier 210A) may be reflected in a voltage of the first EQ node NEQ1 and a voltage of the second EQ node NEQ2.

The control logic may turn on the first and second EQ transistors EQ1 and EQ2 again, and may float the first sense enable line LA (S13). When the first EQ node NEQ1 and the second EQ node NEQ2 are electrically connected again, a bias voltage may be applied to the first EQ node NEQ1 and the second EQ node NEQ2 through the first and second EQ transistors EQ1 and EQ2 (S14), and the first internal power source voltage may be applied to the second sense enable line LAB. Through this process, offset of the bitline sense amplifier may be compensated. In an embodiment, the bias voltage may have a level, lower than a level of the first internal power source voltage and higher than a level of the precharge voltage.

Once the offset is compensated, the bitline BL may be connected to a memory cell (S15). For example, a switch element included in a selected memory cell, among memory cells connected to the bitline BL, may be turned on to connect the selected memory cell to the bitline BL. With the bitline BL connected to the selected memory cell, a charge sharing operation may be performed by turning on the first and second EQ transistors EQ1 and EQ2 and turning off the first and second isolation transistors IT1 and IT2.

Once the charge sharing operation is completed, a sensing operation may be performed. To perform the sensing operation, the first and second isolation transistors IT1 and IT2 may be turned on, the first and second EQ transistors EQ1 and EQ2 may be turned off, and voltages may be applied to the first and second sense enable lines LA and LAB, respectively. (S16). For example, the first internal power source voltage may be applied to the first sense enable line LA, and a second internal power source voltage may be applied to the second sense enable line LAB. The first internal power source voltage may be higher than the precharge voltage, and the second internal power source voltage may be lower than the precharge voltage.

Once the sensing operation is completed, a precharge operation may be performed next. In the precharge operation, the first and second sense enable lines LA and LAB may be floated (S17). Additionally, the first and second isolation transistors IT1 and IT2 and the EQ transistors EQ1 and EQ2 may be turned on, and the precharge voltage may be input to drains of the first and second EQ transistors EQ1 and EQ2. Therefore, voltages of the first and second EQ nodes NEQ1 and NEQ2, voltages of the first and second input nodes IN1 and IN2, a voltage of the bitline BL, and a voltage of the complementary bitline BLB may be reset as the precharge voltage.

FIGS. 12 to 15 are views illustrating an operation of a semiconductor device according to some embodiments.

Figure 12:
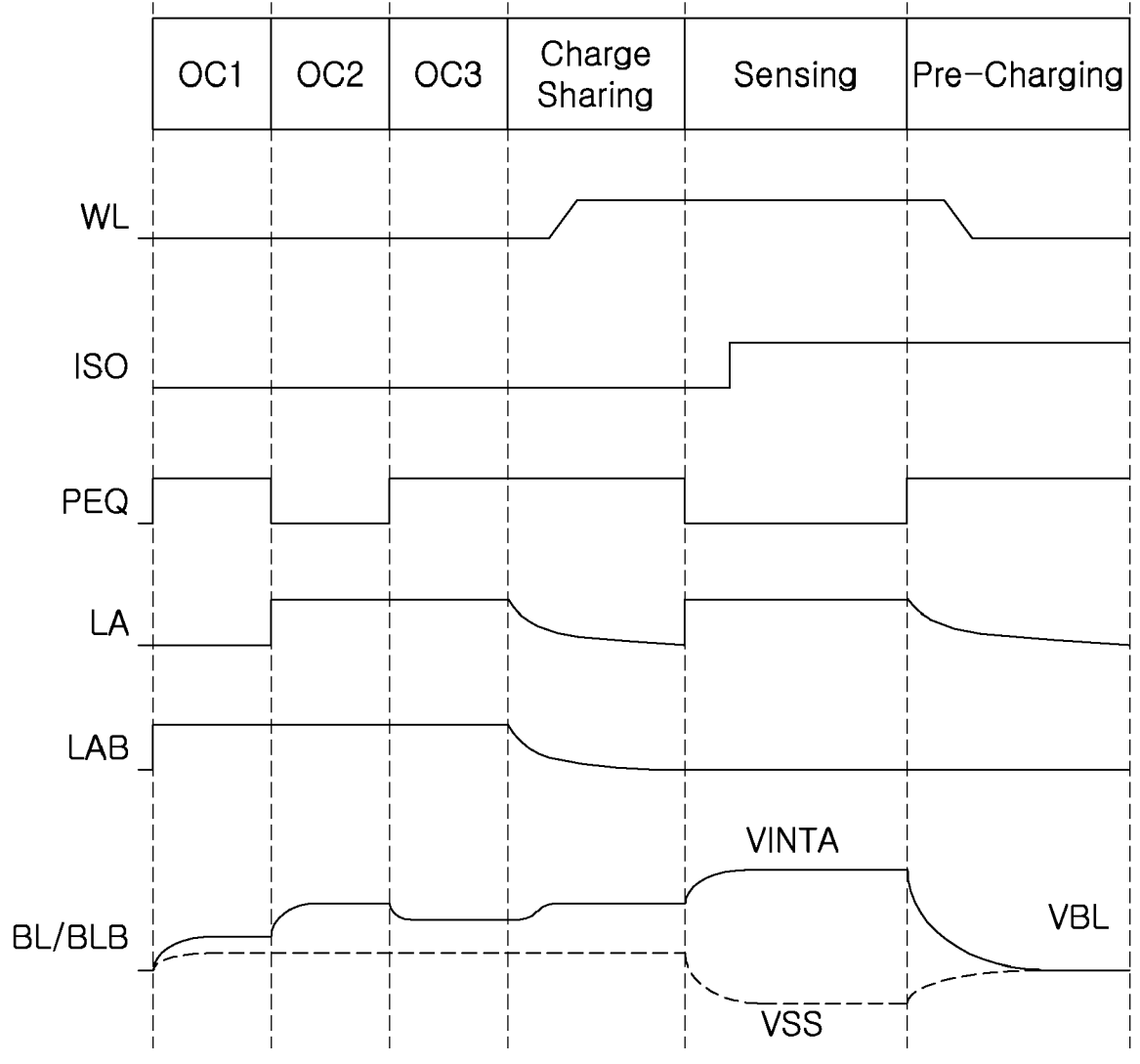
FIGS. 12 to 15 are views illustrating an operation of a semiconductor device according to some embodiments.

FIGS. 12 to 15 may be views illustrating a read operation of a semiconductor device according to an embodiment. Referring to FIG. 12, a read operation according to an embodiment may include an offset canceling operation, a charge sharing operation, a sensing operation, a precharge operation, etc. The offset canceling operation may include first, second, and third offset canceling operations OC1, OC2, and OC3. For example, as described with reference to FIGS. 10A, 10B, and 10C, the first, second, and third offset canceling operations OC1, OC2, and OC3 may be performed.

Depending on an embodiment, the offset canceling operation may include first, second, and third offset canceling operations OC1, OC2, and OC3 described with reference to FIGS. 7A, 7B, and 7C, or first, second, and third offset canceling operations OC1, OC2, and OC3 described with reference to FIGS. 8A, 8B, and 8C. Additionally, depending on an embodiment, the offset canceling operation may include first, second, and third offset canceling operations OC1, OC2, and OC3 described with reference to FIGS. 9A, 9B, and 9C.

Figure 13:
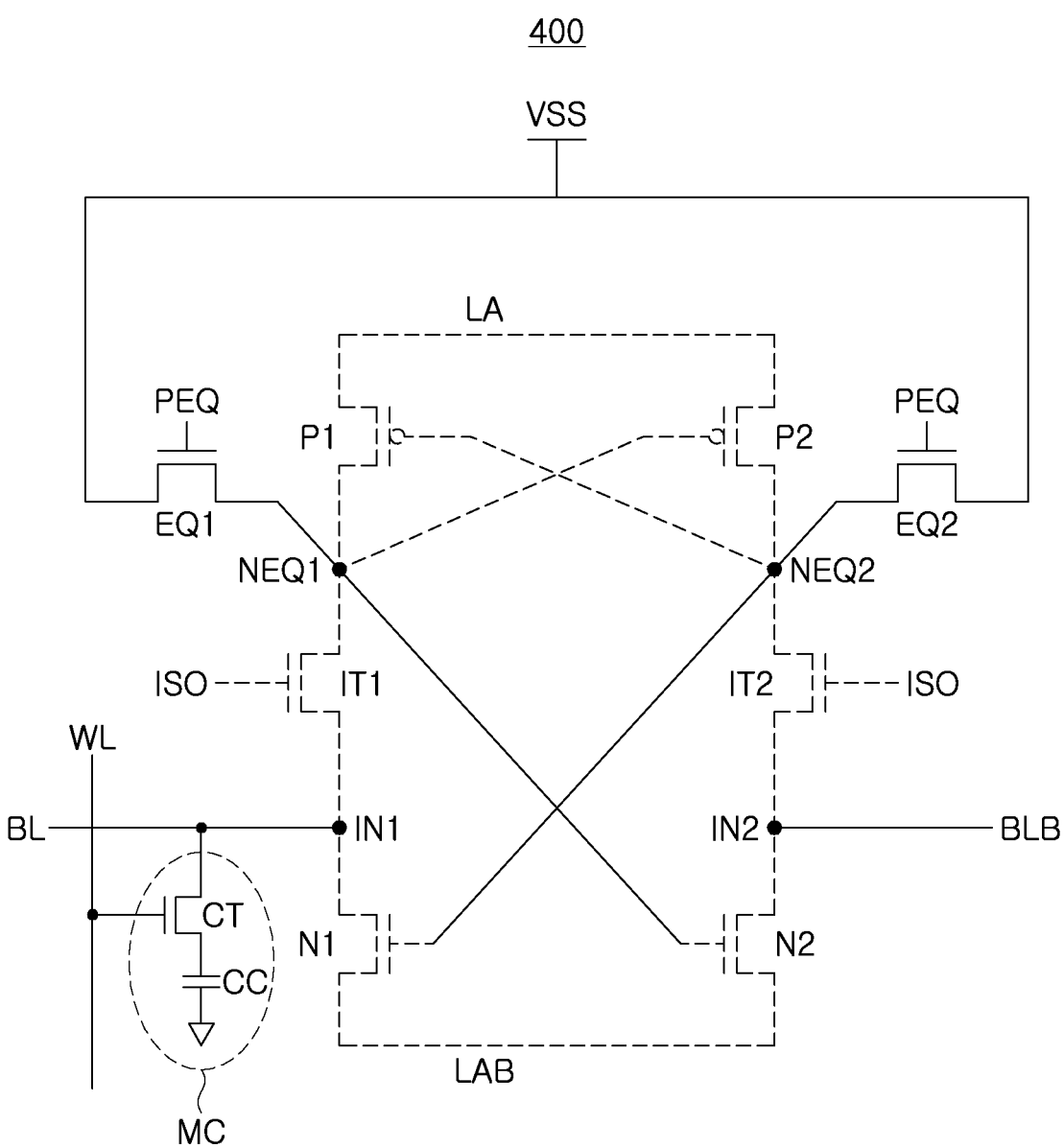

Referring to FIG. 13, in a charge sharing operation, a bitline BL may be connected to a selected memory cell MC, a voltage of a wordline WL connected to the selected memory cell MC may increase to turn on a switch element CT, a cell capacitor CC may be connected to the bitline BL. First and second EQ transistors EQ1 and EQ2 may be turned on, and a second internal power source voltage VSS may be applied to first and second EQ nodes NEQ1 and NEQ2 by the first and second EQ transistors EQ1 and EQ2.

In the charge sharing operation, first and second isolation transistors IT1 and IT2 may be turned off, and a first sense enable line LA and a second sense enable line LAB may be floating. Transistors P1, P2, N1, and N2 in a P-type sense amplifier and an N-type sense amplifier may all be turned off.

The embodiment described with reference to FIG. 12 may be an example in which charges are charged in the cell capacitor CC of the selected memory cell MC connected to the bitline BL. Therefore, a voltage of the bitline BL may increase due to the charge sharing operation.

Next, in a sensing operation, a first internal power source voltage VINTA may be input to the first sense enable line LA, and a second internal power source voltage VSS may be input to the second sense enable line LAB. Additionally, the first and second EQ transistors EQ1 and EQ2 may be turned off, and the first and second isolation transistors IT1 and IT2 may be turned on.

Figure 14:
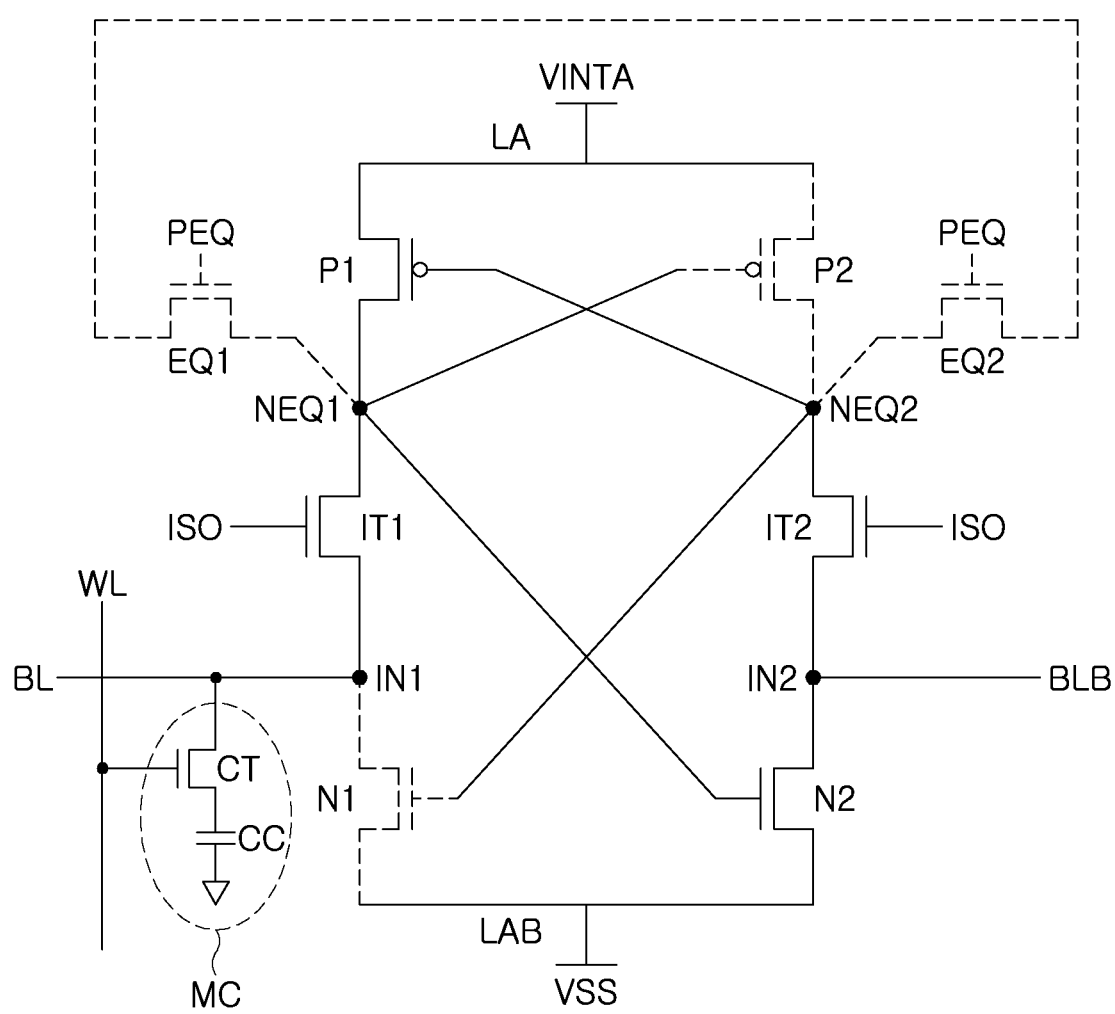

Since the voltage of the bitline BL increases due to the charge sharing operation, as illustrated in FIG. 14, the voltage of the first EQ node NEQ1 may increase, and a second NMOS transistor N2 may be turned on. As the second NMOS transistor N2 is turned on, a voltage of the second EQ node NEQ2 may decrease, and thus a first PMOS transistor P1 may be turned on. A second PMOS transistor P2 and a first NMOS transistor N1 may be turned off.

Figure 15:
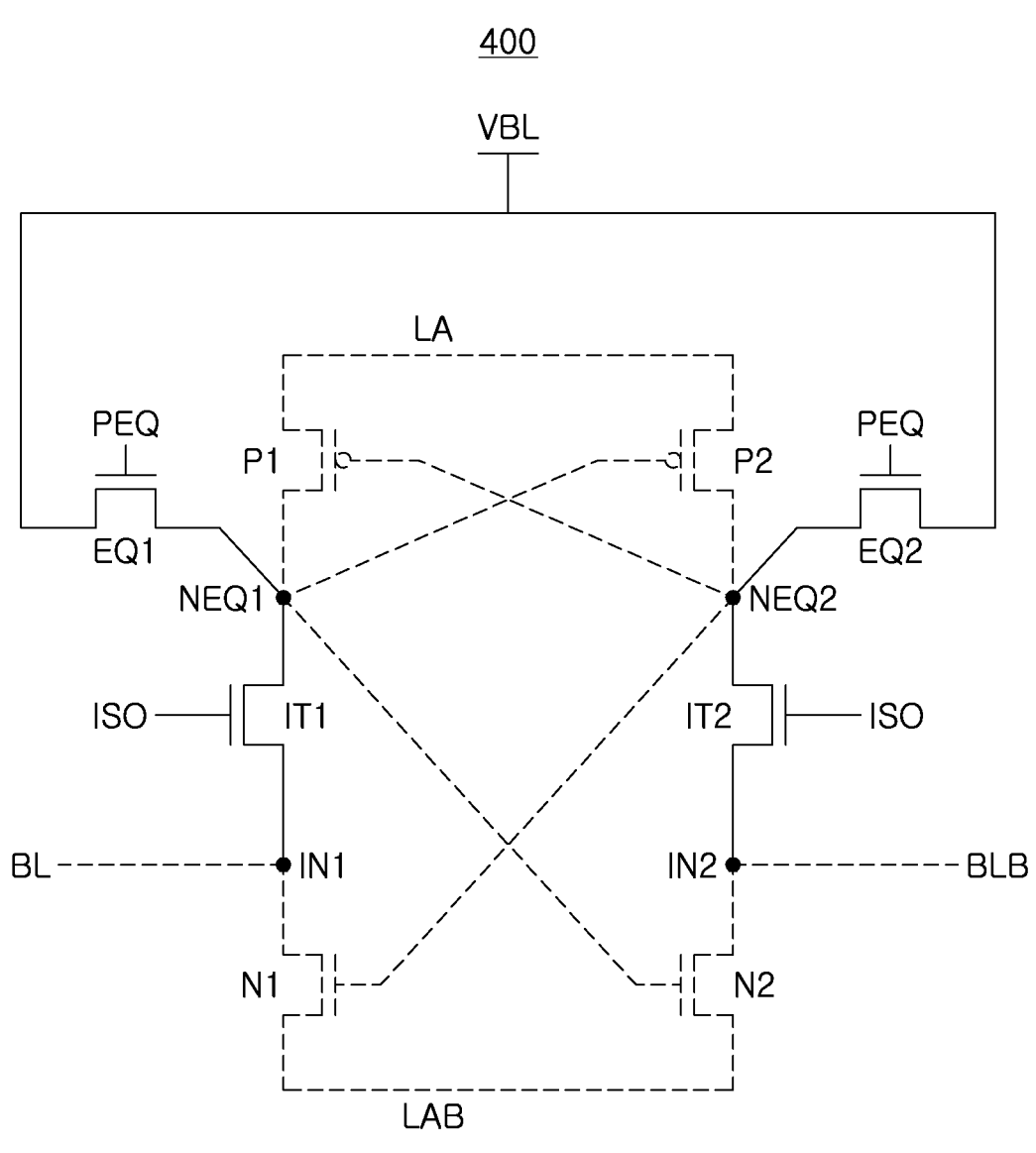

When the sensing operation is completed, the precharge operation may be performed. For example, the precharge operation may be an operation for resetting voltages of the first and second EQ nodes NEQ1 and NEQ2, voltages of the first and second input nodes IN1 and IN2, a voltage of the bitline BL and a voltage of the complementary bitline BLB as a precharge voltage VBL. It could be a movement. Referring to FIG. 15, in the precharge operation, the first sense enable line LA and the second sense enable line LAB may be floating.

The first and second EQ transistors EQ1 and EQ2 and the first and second isolation transistors IT1 and IT2 may be all turned on, and the precharge voltage VBL may be applied to drains of the first and second EQ transistors EQ1 and EQ2. Therefore, the voltages of the first and second EQ nodes NEQ1 and NEQ2, the voltages of the first and second input nodes IN1 and IN2, the voltage of the bitline BL, and the voltage of the complementary bitline BLB may be set as the precharge voltage VBL.

Figure 16:
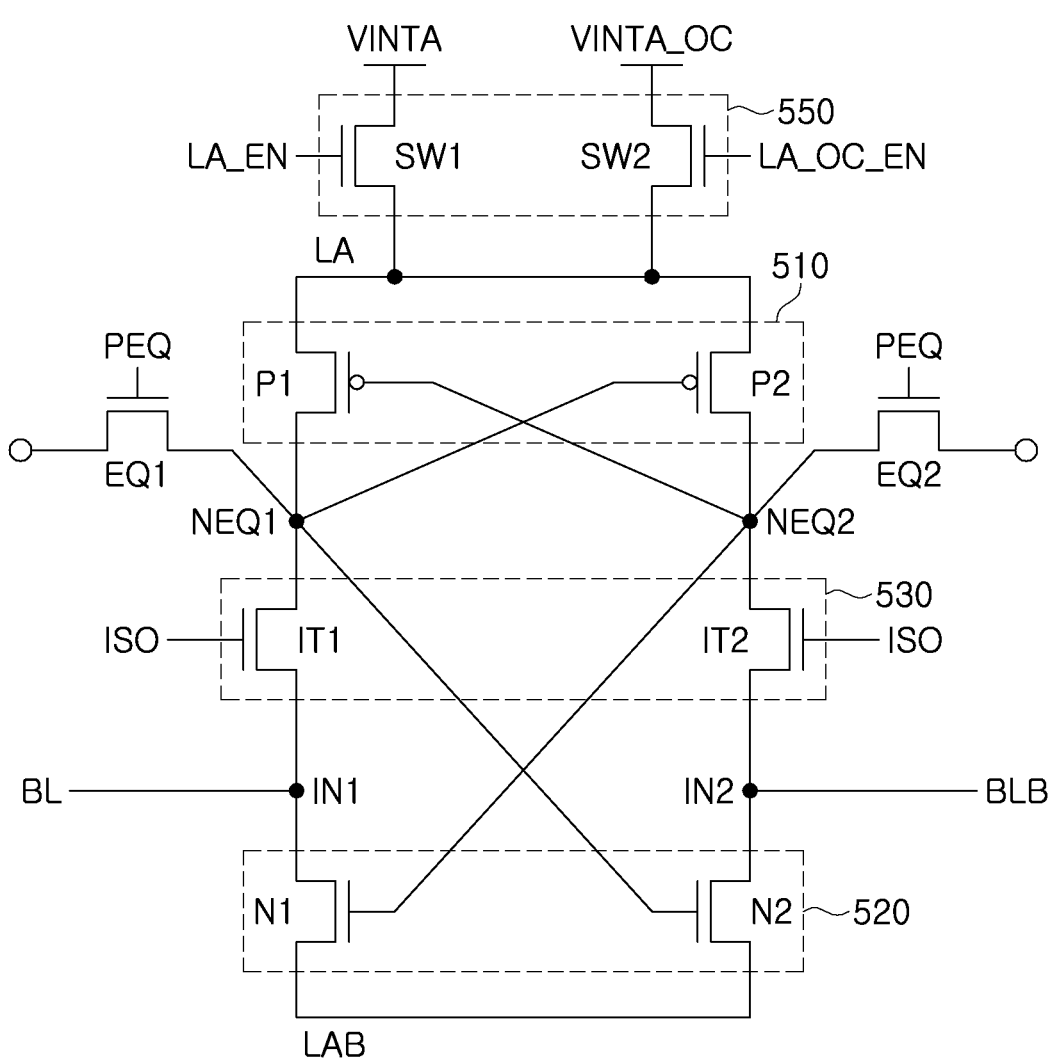
FIGS. 16 to 18 are circuit diagrams illustrating a bitline sense amplifier according to some embodiments.
Figure 17:
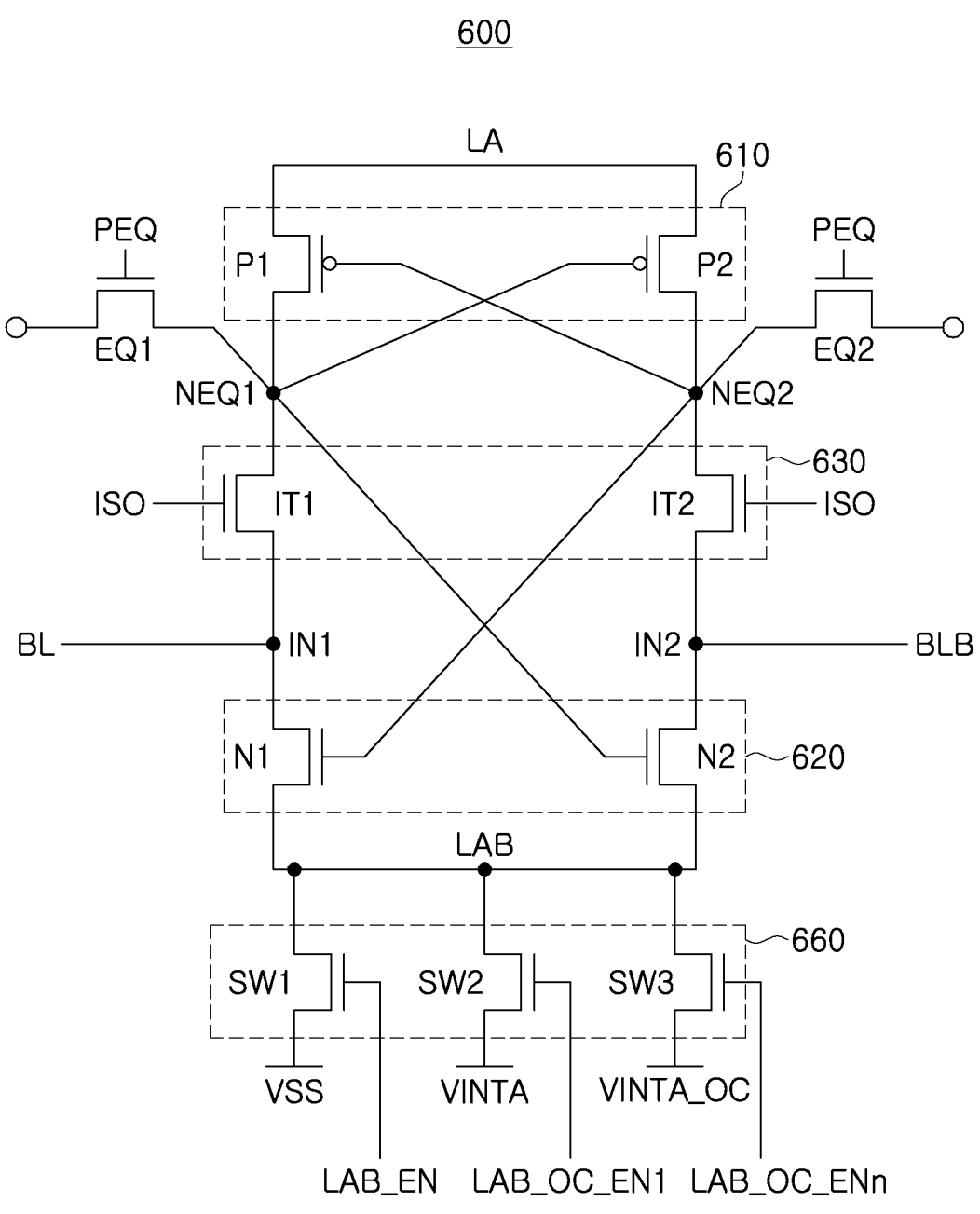
Figure 18:
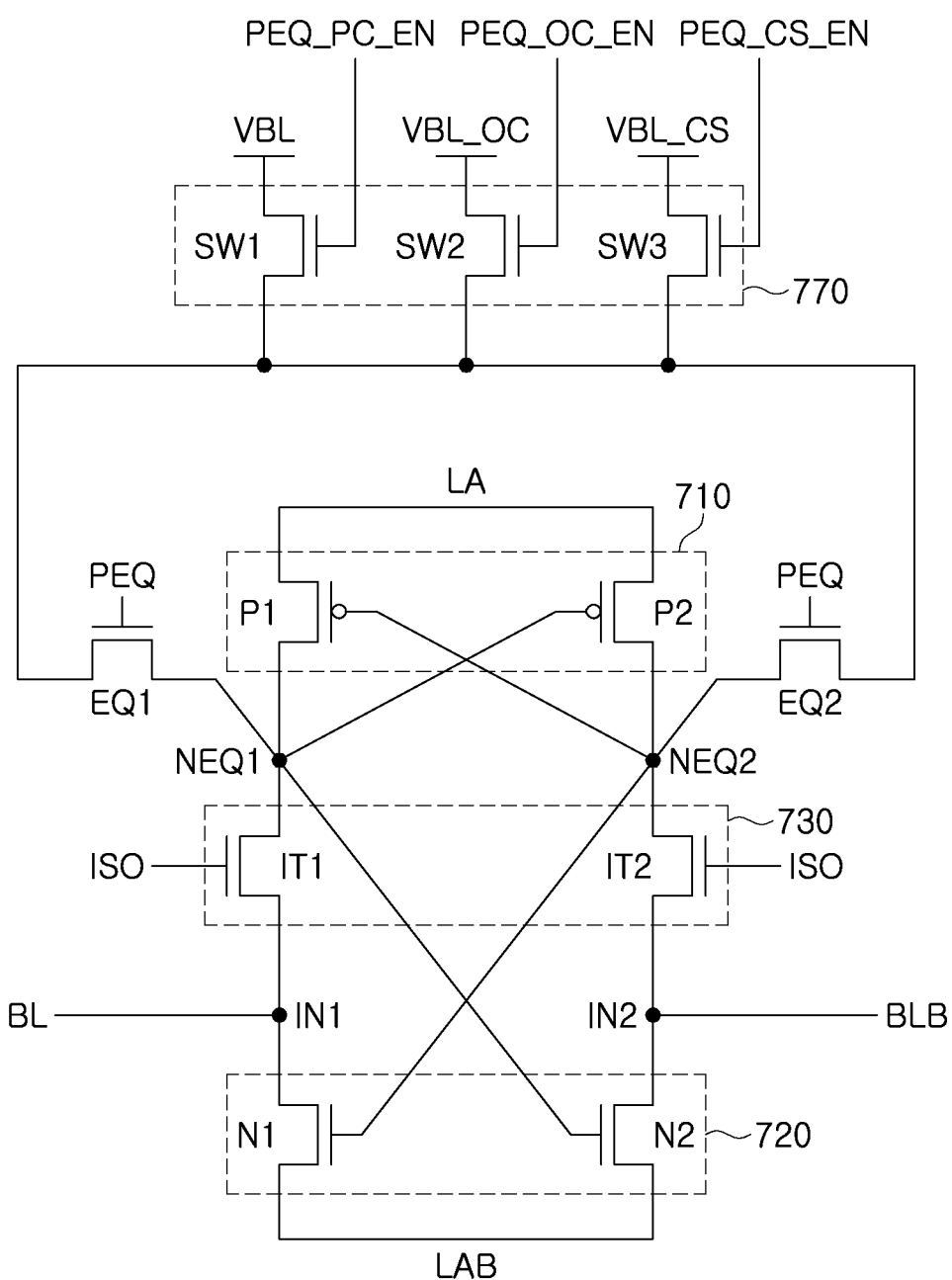

FIGS. 16 to 18 are circuit diagrams illustrating a bitline sense amplifier according to some embodiments.

First, referring to FIG. 16, a bitline sense amplifier 500 according to an embodiment may include a P-type sense amplifier 510, an N-type sense amplifier 520, an isolation circuit 530, etc. first and second EQ transistors EQ1 and EQ2 may be connected to first and second EQ nodes NEQ1 and NEQ2 between the isolation circuit 530 and the P-type sense amplifier 510. A bitline BL and a complementary bitline BLB may be connected to input nodes IN1 and IN2 between the isolation circuit 530 and the N-type sense amplifier 520.

In the embodiment illustrated in FIG. 16, a first switch circuit 550 may be connected to a first sense enable line LA. The first switch circuit 550 may include first and second switch elements SW1 and SW2, and the first and second switch elements SW1 and SW2 may be turned on/off by different control signals LA_EN and LA_OC_EN.

For example, the first switch element SW1 may be turned on/off by the first control signal LA_EN, and may be connected between a node supplying a first internal power source voltage VINTA and the first sense enable line LA.

The second switch element SW2 may be turned on/off by the second control signal LA_OC_EN, and may be connected between a node supplying a first variable power source voltage VINTA_OC and the first sense enable line LA. Unlike the first internal power source voltage VINTA, which has a fixed level, a level of the first variable power source voltage VINTA_OC may be changed by a control logic (e.g., the control logic 12 in FIG. 1). Therefore, when necessary for an offset canceling operation, a sensing operation, or the like, the control logic may set a voltage of the first sense enable line LA to have a desired level.

Next, referring to FIG. 17, a bitline sense amplifier 600 according to an embodiment may include a P-type sense amplifier 610, an N-type sense amplifier 620, an isolation circuit 630, etc. First and second EQ transistors EQ1 and EQ2 may be connected to first and second EQ nodes NEQ1 and NEQ2 between the isolation circuit 630 and the P-type sense amplifier 610. A bitline BL and a complementary bitline BLB may be connected to first and second input nodes IN1 and IN2 between the isolation circuit 630 and the N-type sense amplifier 620.

In the embodiment illustrated in FIG. 17, a second switch circuit 660 may be connected to a second sense enable line LAB. The second switch circuit 660 may include first, second, and third switch elements SW1, SW2, and SW3, and the first, second, and third switch elements SW1, SW2, and SW3 may be turned on/off by different control signals, for examples, first, second, and third LAB_EN, LAB_OC_EN1, and LAB_OC_EN2.

For example, the first switch element SW1 may be turned on/off by the first control signal LAB_EN, and may be connected between a node supplying a second internal power source voltage VSS and the second sense enable line LAB. In an embodiment, the first switch element SW1 may be turned on during a sensing operation of the bitline sense amplifier 600 to apply the second internal power source voltage VSS to the second sense enable line LAB.

The second switch element SW2 may be turned on/off by the second control signal LAB_OC_EN1, and may be connected between a node supplying a first internal power source voltage VINTA and the second sense enable line LAB. For example, the second switch element SW2 may be turned on during an offset canceling operation of the bitline sense amplifier 600.

The third switch element SW3 may be turned on/off by the third control signal LAB_OC_EN2, and may be connected between a node supplying a first variable power source voltage VINTA_OC and the second sense enable line LAB. Unlike the first internal power source voltage VINTA, which has a fixed level, a level of the first variable power source voltage VINTA_OC may be changed by a control logic. Therefore, when necessary for an offset canceling operation, a sensing operation, or the like, the control logic may set a voltage of the second sense enable line LAB to have a desired level.

Referring to FIG. 18, a bitline sense amplifier 700 according to an embodiment may include a P-type sense amplifier 710, an N-type sense amplifier 720, an isolation circuit 730, etc. First and second EQ transistors EQ1 and EQ2 may be connected to first and second EQ nodes NEQ1 and NEQ2 between the isolation circuit 730 and the P-type sense amplifier 710. A bitline BL and a complementary bitline BLB may be connected to first and second input nodes IN1 and IN2 between the isolation circuit 730 and the N-type sense amplifier 720. In the embodiment illustrated in FIG. 18, a drain of a first EQ transistor EQ1 and a drain of a second EQ transistor EQ2 may be (commonly) connected to a third switch circuit 770. The third switch circuit 770 may include first, second, and third switch elements SW1, SW2, and SW3, and the first, second, and third switch elements SW1, SW2, and SW3 may be controlled by different control signals, such as first, second, and third control signals PEQ_PC_EN, PEQ_OC_EN, and PEQ_CS_EN.

For example, the first switch element SW1 may be turned on/off by the first control signal PEQ_PC_EN, and may be connected between a node supplying a precharge voltage VBL and the drains of the first and second EQ transistors EQ1 and EQ2. In an embodiment, a first switch element SW1 may be turned on during an offset canceling operation and/or a precharge operation, etc. of the bitline sense amplifier 700 to apply the precharge voltage VBL to the drains of the first and second EQ transistors EQ1 and EQ2. In some embodiments, the first switch element SW1 may be turned on during the precharge operation to apply the precharge voltage VBL to the bitline BL and the complementary bitline BLB.

The second switch element SW2 may be turned on/off by the second control signal PEQ_OC_EN, and may be connected between a node supplying a first variable precharge voltage VBL_OC and the drains of the first and second EQ transistors EQ1 and EQ2. For example, the second switch element SW2 may be turned on during an offset canceling operation of the bitline sense amplifier 700. A level of the first variable precharge voltage VBL_OC may be changed by a control logic of a semiconductor device. In an embodiment, the level of the first variable precharge voltage VBL_OC may be higher than a level of the precharge voltage VBL.

The third switch element SW3 may be turned on/off by the third control signal PEQ_CS_EN, and may be connected between a node supplying a second variable precharge voltage VBL_CS and the drain of the first and second EQ transistors EQ1 and EQ2. For example, a third switch element SW3 may be turned on during a charge sharing operation of the bitline sense amplifier 700. A level of the second variable precharge voltage VBL_CS may be changed by the control logic of the semiconductor device.

The first switch circuit 550, the second switch circuit 660, and the third switch circuit 770, according to the embodiments described with reference to FIGS. 16, 17, and 18, may be cross-applied. For example, the first switch circuit 550 may be connected to the first sense enable line LA of the bitline sense amplifier, and the second switch circuit 660 may be connected to the second sense enable line LAB. In another example, the second switch circuit 660 may be connected to the second sense enable line LAB of the bitline sense amplifier, and the drains of the first and second EQ transistors EQ1 and EQ2 may be connected to the third switch circuit 770. In another example, the first sense enable line LA of the bitline sense amplifier may be connected to the first switch circuit 550, and the drains of the first and second EQ transistors EQ1 and EQ2 may be connected to the third switch circuit 770. As another example, the first switch circuit 550 may be connected to the first sense enable line LA of the bitline sense amplifier, and the second switch circuit 660 may be connected to the second sense enable line LAB. The drains of the EQ transistors EQ1 and EQ2 may be connected to the third switch circuit 770.

According to an embodiment, a plurality of elements included in a bitline sense amplifier may be arranged according to a symmetrical layout, and thus an offset component occurring due to asymmetry of a layout may be reduced. Additionally, accuracy and reliability of a read operation performed by the bitline sense amplifier may be improved by compensating for offset of an N-type sense amplifier and offset of a P-type sense amplifier, included in the bitline sense amplifier.

Various advantages and effects of the present inventive concept are not limited to the above-described content, and can be more easily understood through description of specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A bitline sense amplifier comprising:
a P-type sense amplifier including a first p-channel metal-oxide-semiconductor (PMOS) transistor and a second PMOS transistor, wherein the first PMOS transistor and the second PMOS transistor are electrically connected to a first sense enable line;
an N-type sense amplifier including a first n-channel metal-oxide-semiconductor (NMOS) transistor and a second NMOS transistor, wherein the first NMOS transistor and the second NMOS transistor are electrically connected to a second sense enable line;
a first isolation transistor electrically connected to the first PMOS transistor and to the first NMOS transistor;
a second isolation transistor electrically connected to the second PMOS transistor and to the second NMOS transistor;
a first transistor electrically connected to a first node that is between the first PMOS transistor and the first isolation transistor; and
a second transistor electrically connected to a second node that is between the second PMOS transistor and the second isolation transistor.

2. The bitline sense amplifier of claim 1, further comprising:
a first input node between the first NMOS transistor and the first isolation transistor; and
a second input node between the second NMOS transistor and the second isolation transistor,
wherein the first input node is configured to be electrically connected to a bitline, and
wherein the second input node is configured to be electrically connected to a complementary bitline.

3. The bitline sense amplifier of claim 1, wherein a source of the first transistor is electrically connected to the first node, and a source of the second transistor is electrically connected to the second node, and
wherein a drain of the first transistor is directly connected to a drain of the second transistor.

4. The bitline sense amplifier of claim 1, wherein a source of the first transistor is electrically connected to the first node, and a source of the second transistor is electrically connected to the second node, and
wherein a drain of the first transistor is electrically isolated from a drain of the second transistor.

5. The bitline sense amplifier of claim 1, wherein the first PMOS transistor, the second PMOS transistor, the first NMOS transistor, the second NMOS transistor, the first isolation transistor, the second isolation transistor, the first transistor, and the second transistor are arranged in a first region of a substrate in a first direction, parallel to an upper surface of the substrate.

6. The bitline sense amplifier of claim 5, wherein, in the first direction, the first isolation transistor and the first transistor are between the first NMOS transistor and the first PMOS transistor, and the second isolation transistor and the second transistor are between the second NMOS transistor and the second PMOS transistor.

7. The bitline sense amplifier of claim 6, wherein the first PMOS transistor and the second PMOS transistor are adjacent to each other in the first direction.

8. A semiconductor device comprising:
a P-type sense amplifier and an N-type sense amplifier, wherein the P-type sense amplifier and the N-type sense amplifier are electrically connected to a bitline and a complementary bitline;
a first isolation transistor and a second isolation transistor that are electrically connected to the P-type sense amplifier and to the N-type sense amplifier;
a first transistor electrically connected to a first node that is between the first isolation transistor and the P-type sense amplifier;
a second transistor electrically connected to a second node that is between the second isolation transistor and the P-type sense amplifier; and
a control logic configured to control on-off switching of each of the first isolation transistor, the second isolation transistor, the first transistor, and the second transistor, and configured to control a voltage of a first sense enable line electrically connected to the P-type sense amplifier and a voltage of a second sense enable line electrically connected to the N-type sense amplifier,
wherein the control logic is further configured to turn on the first transistor and the second transistor and turn off the first isolation transistor and the second isolation transistor in a first offset canceling operation, turn off the first transistor and the second transistor and input a first power voltage to each of the first sense enable line and the second sense enable line in a second offset canceling operation, and turn on the first transistor and the second transistor in a third offset canceling operation.

9. The semiconductor device of claim 8, wherein the control logic is further configured to turn on or off the first isolation transistor and the second isolation transistor together in the first offset canceling operation and the third offset canceling operation, and
wherein the control logic is further configured to turn on or off the first transistor and the second transistor in the first offset canceling operation and the third offset canceling operation.

10. The semiconductor device of claim 8, wherein the control logic is further configured to float the first sense enable line and input the first power voltage to the second sense enable line in each of the first offset canceling operation and the third offset canceling operation.

11. The semiconductor device of claim 8, wherein the control logic is further configured to input the first power voltage to the first sense enable line and the second sense enable line in each of the first offset canceling operation and the third offset canceling operation.

12. The semiconductor device of claim 8, wherein the control logic is further configured to input the first power voltage to the first sense enable line and the second sense enable line in the first offset canceling operation and further configured to float the first sense enable line and input the first power voltage to the second sense enable line in the third offset canceling operation.

13. The semiconductor device of claim 8, wherein the control logic is further configured to float the first sense enable line and input the first power voltage to the second sense enable line in the first offset canceling operation and further configured to input the first power voltage to the first sense enable line and the second sense enable line in the third offset canceling operation.

14. The semiconductor device of claim 8, further comprising:

a first switch circuit electrically connected to the first sense enable line;

a second switch circuit electrically connected to the second sense enable line; and a third switch circuit electrically connected to both a drain of the first transistor and a drain of the second transistor.

15. The semiconductor device of claim 14, wherein at least one of the first switch circuit, the second switch circuit, and the third switch circuit comprises a plurality of switch elements electrically connected in parallel to each other, and wherein the switch elements are configured to be electrically connected to voltage nodes supplying different voltages.

16. The semiconductor device of claim 15, wherein the control logic is further configured to control a voltage of at least one voltage node among the voltage nodes.

17. The semiconductor device of claim 14, wherein the third switch circuit comprises a first switch element, a second switch element, and a third switch element, and wherein the first switch element is configured to be turned on in a precharge operation that resets a voltage of the bitline and a voltage of the complementary bitline as a precharge voltage, the second switch element is configured to be turned on in at least one of the first offset canceling operation and the third offset canceling operation, and the third switch element is configured to be turned on in a charge sharing operation in which the bitline is electrically connected to a memory cell.

18. A semiconductor device comprising:

a bitline sense amplifier electrically connected to a bitline, a complementary bitline, a first sense enable line, and a second sense enable line; and a control logic configured to control the bitline sense amplifier to execute a read operation to read data from a memory cell electrically connected to the bitline, wherein the bitline sense amplifier includes a P-type sense amplifier electrically connected to the first sense enable line, an N-type sense amplifier electrically connected to the second sense enable line, an isolation circuit electrically connected to the P-type sense amplifier and to the N-type sense amplifier, and an offset canceling circuit electrically connected to nodes that are between the P-type sense amplifier and the isolation circuit, wherein the control logic is further configured to electrically connect the nodes to each other through the offset canceling circuit to compensate for an offset of the N-type sense amplifier and an offset of the P-type sense amplifier, while isolating the P-type sense amplifier and the N-type sense amplifier and applying a first power supply voltage to the second sense enable line, and wherein the bitline sense amplifier includes transistors that are symmetrically positioned.

19. The semiconductor device of claim 18, wherein the control logic is further configured to control the offset canceling circuit to electrically connect, electrically disconnect, and electrically connect the nodes to each other sequentially, in an offset canceling operation compensating for the offset of the N-type sense amplifier and the offset of the P-type sense amplifier.

20. The semiconductor device of claim 18, wherein the control logic is further configured to apply a voltage of a predetermined level to the nodes through the offset canceling circuit or the first sense enable line, in an offset canceling operation compensating for the offset of the N-type sense amplifier and the offset of the P-type sense amplifier.

* * * * *